United States Patent
Yamazaki et al.

(10) Patent No.: US 11,803,209 B2
(45) Date of Patent: Oct. 31, 2023

(54) ELECTRONIC DEVICE INCLUDING DISPLAY PANEL

(71) Applicant: Semiconductor Energy Laboratory Co., Ltd., Atsugi (JP)

(72) Inventors: Shunpei Yamazaki, Setagaya (JP); Yoshiharu Hirakata, Ebina (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/460,545

(22) Filed: Aug. 30, 2021

(65) Prior Publication Data
US 2022/0050496 A1    Feb. 17, 2022

Related U.S. Application Data

(63) Continuation of application No. 16/218,739, filed on Dec. 13, 2018, now Pat. No. 11,112,821, which is a (Continued)

(30) Foreign Application Priority Data

Sep. 3, 2012 (JP) ................................ 2012-193575

(51) Int. Cl.
   *G06F 1/16*    (2006.01)
   *H05K 1/14*    (2006.01)
   (Continued)

(52) U.S. Cl.
CPC .......... *G06F 1/1601* (2013.01); *G06F 1/1626* (2013.01); *G06F 1/1637* (2013.01); (Continued)

(58) Field of Classification Search
CPC ......... G02F 1/133305; G02F 1/133308; G02F 1/13452; G06F 1/1652; G06F 1/1601; G06F 1/1637; G06F 1/1626; H05K 1/147
See application file for complete search history.

(56) References Cited

U.S. PATENT DOCUMENTS 5,592,362 A    1/1997    Ohgami et al.
5,738,536 A    4/1998    Ohgami et al.
(Continued)

FOREIGN PATENT DOCUMENTS

CN    101015237 A    8/2007
CN    101727234 A    6/2010
(Continued)

OTHER PUBLICATIONS

International Search Report (Application No. PCT/JP2013/073074) dated Nov. 26, 2013.
(Continued)

*Primary Examiner* — James Wu
(74) *Attorney, Agent, or Firm* — ROBINSON INTELLECTUAL PROPERTY LAW OFFICE; Eric J. Robinson

(57) ABSTRACT

A display device includes a display panel mounted on a curved surface, and driver circuits including circuit elements which are mounted on a plurality of plane surfaces provided on the back of the curved surface in a stepwise shape along the curved surface.

12 Claims, 9 Drawing Sheets

Related U.S. Application Data continuation of application No. 16/055,591, filed on Aug. 6, 2018, now Pat. No. 10,437,283, which is a continuation of application No. 14/010,869, filed on Aug. 27, 2013, now Pat. No. 10,120,410.

(51) Int. Cl.
G02F 1/1333 (2006.01)
G02F 1/1345 (2006.01)

(52) U.S. Cl.
CPC .... *G02F 1/13452* (2013.01); *G02F 1/133305* (2013.01); *G02F 1/133308* (2013.01); *G06F 1/1652* (2013.01); *H05K 1/147* (2013.01)

(56) References Cited

U.S. PATENT DOCUMENTS

| | | | |
|---|---|---|---|
| 5,883,465 A | 3/1999 | Inoguchi et al. | |
| 6,035,180 A | 3/2000 | Kubes et al. | |
| 6,191,938 B1 | 2/2001 | Ohgami et al. | |
| 6,407,508 B1 | 6/2002 | Kawada et al. | |
| 6,573,652 B1 | 6/2003 | Graff et al. | |
| 6,738,111 B2 | 5/2004 | Kawata | |
| 6,847,415 B1 | 1/2005 | Yoshimura et al. | |
| 6,859,365 B2 | 2/2005 | Koiwa et al. | |
| 6,989,817 B2 | 1/2006 | Tajima | |
| 7,166,006 B2 | 1/2007 | Cok | |
| 7,345,878 B2 | 3/2008 | Kim | |
| 7,401,758 B2 | 7/2008 | Liang et al. | |
| 7,605,525 B2 | 10/2009 | Kim | |
| 7,722,245 B2 | 5/2010 | Baba et al. | |
| 7,884,808 B2 * | 2/2011 | Joo | G06F 1/165 345/169 |
| 8,194,222 B2 | 6/2012 | Seki et al. | |
| 8,610,155 B2 | 12/2013 | Hatano et al. | |
| 8,873,015 B2 | 10/2014 | Seki et al. | |
| D724,578 S | 3/2015 | Yamazaki et al. | |
| 9,119,293 B2 | 8/2015 | Mycroft et al. | |
| D738,367 S | 9/2015 | Yamazaki et al. | |
| 9,686,873 B2 | 6/2017 | Mycroft et al. | |
| 11,112,821 B2 * | 9/2021 | Yamazaki | G06F 1/1601 |
| 2002/0003711 A1 | 1/2002 | Hashimoto et al. | |
| 2002/0027636 A1 | 3/2002 | Yamada | |
| 2002/0047852 A1 | 4/2002 | Inukai et al. | |
| 2002/0047952 A1 | 4/2002 | Kawata | |
| 2003/0152717 A1 | 8/2003 | Kawahara et al. | |
| 2003/0201974 A1 | 10/2003 | Yin | |
| 2006/0012963 A1 | 1/2006 | Nishimura et al. | |
| 2006/0132386 A1 | 6/2006 | Tajima | |
| 2006/0202618 A1 | 9/2006 | Ishii et al. | |
| 2006/0216909 A1 | 9/2006 | Yamazaki et al. | |
| 2006/0273304 A1 * | 12/2006 | Cok | H01L 51/524 438/26 |
| 2007/0085138 A1 | 4/2007 | Yamazaki et al. | |
| 2007/0177075 A1 | 8/2007 | Kimoto | |
| 2008/0002161 A1 | 1/2008 | Streid et al. | |
| 2008/0042997 A1 | 2/2008 | Endo | |
| 2008/0223708 A1 | 9/2008 | Joo | |
| 2008/0224361 A1 | 9/2008 | Liang et al. | |
| 2009/0122223 A1 | 5/2009 | Hayano et al. | |
| 2009/0161048 A1 | 6/2009 | Satake et al. | |
| 2010/0090981 A1 | 4/2010 | Park et al. | |
| 2010/0253902 A1 | 10/2010 | Yamazaki et al. | |
| 2010/0282293 A1 | 11/2010 | Meyer et al. | |
| 2010/0293782 A1 | 11/2010 | Yamazaki et al. | |
| 2011/0068492 A1 | 3/2011 | Chen et al. | |
| 2011/0080694 A1 | 4/2011 | Kao | |
| 2011/0095975 A1 | 4/2011 | Hwang. et al. | |
| 2011/0166690 A1 | 7/2011 | Ternus et al. | |
| 2011/0299025 A1 | 12/2011 | Sahouani et al. | |
| 2011/0318889 A1 | 12/2011 | Chida | |
| 2012/0020056 A1 | 1/2012 | Yamagata et al. | |
| 2012/0081874 A1 | 4/2012 | Wu et al. | |
| 2012/0182677 A1 | 7/2012 | Seo | |
| 2012/0314546 A1 | 12/2012 | Brewer et al. | |
| 2013/0002133 A1 | 1/2013 | Jin et al. | |
| 2013/0050155 A1 | 2/2013 | Petersen et al. | |
| 2013/0100392 A1 | 4/2013 | Fukushima | |
| 2013/0140965 A1 * | 6/2013 | Franklin | G06F 1/1626 312/223.1 |
| 2013/0208211 A1 | 8/2013 | Que | |
| 2014/0099999 A1 | 4/2014 | Hatano et al. | |
| 2018/0011351 A1 | 1/2018 | Yamazaki et al. | |
| 2019/0113780 A1 | 4/2019 | Yamazaki et al. | |

FOREIGN PATENT DOCUMENTS

| | | |
|---|---|---|
| CN | 102621719 A | 8/2012 |
| EP | 1065720 A | 1/2001 |
| EP | 1191411 A | 3/2002 |
| EP | 1237036 A | 9/2002 |
| EP | 1809086 A | 7/2007 |
| EP | 1909253 A | 4/2008 |
| EP | 2058692 A | 5/2009 |
| EP | 2177972 A | 4/2010 |
| EP | 2187443 A | 5/2010 |
| JP | 53-090970 A | 8/1978 |
| JP | 61-030978 | 2/1986 |
| JP | 62-105185 A | 5/1987 |
| JP | 63-253987 A | 10/1988 |
| JP | 63-254698 A | 10/1988 |
| JP | 02-227989 A | 9/1990 |
| JP | 06-066968 A | 3/1994 |
| JP | 06-160820 A | 6/1994 |
| JP | 06-053995 | 7/1994 |
| JP | 07-013144 A | 1/1995 |
| JP | 07-129275 A | 5/1995 |
| JP | 08-201549 A | 8/1996 |
| JP | 11-281999 A | 10/1999 |
| JP | 2000-098349 A | 4/2000 |
| JP | 2001-013883 A | 1/2001 |
| JP | 2001-117069 A | 4/2001 |
| JP | 2001-154592 A | 6/2001 |
| JP | 2001-519585 | 10/2001 |
| JP | 2001-356323 A | 12/2001 |
| JP | 2002-032131 A | 1/2002 |
| JP | 2002-049021 A | 2/2002 |
| JP | 2002-090711 A | 3/2002 |
| JP | 2002-258758 A | 9/2002 |
| JP | 2002-351347 A | 12/2002 |
| JP | 2003-216057 A | 7/2003 |
| JP | 2003-345286 A | 12/2003 |
| JP | 2004-093244 A | 3/2004 |
| JP | 2005-116339 A | 4/2005 |
| JP | 2006-139260 A | 6/2006 |
| JP | 2006-189838 A | 7/2006 |
| JP | 2007-078670 A | 3/2007 |
| JP | 2007-272107 A | 10/2007 |
| JP | 2007-535416 | 12/2007 |
| JP | 2008-096543 A | 4/2008 |
| JP | 2008-233779 A | 10/2008 |
| JP | 2009-115686 A | 5/2009 |
| JP | 2009-164762 A | 7/2009 |
| JP | 2010-153813 A | 7/2010 |
| JP | 2010-262275 A | 11/2010 |
| JP | 2012-028761 A | 2/2012 |
| JP | 2012-078825 A | 4/2012 |
| JP | Des.1469681 | 5/2013 |
| JP | Des.1472565 | 6/2013 |
| KR | 2010-0076357 A | 7/2010 |
| KR | 2012-0055018 A | 5/2012 |
| TW | 525117 | 3/2003 |
| TW | 201214368 | 4/2012 |
| TW | M430655 | 6/2012 |
| WO | WO-1999/018590 | 4/1999 |
| WO | WO-2005/002305 | 1/2005 |
| WO | WO-2011/103317 | 8/2011 |
| WO | WO-2011/114190 | 9/2011 |
| WO | WO-201 2/002272 | 1/2012 |

OTHER PUBLICATIONS

(56) References Cited

OTHER PUBLICATIONS

Written Opinion (Application No. PCT/JP2013/073074) dated Nov. 26, 2013.
Chinese Office Action (Application No. 201380045896.9) dated Aug. 15, 2016.
Chinese Office Action (Application No. 201380045896.9) dated Mar. 13, 2017.
Taiwanese Office Action (Application No. 106105107) dated Mar. 27, 2017.
Taiwanese Office Action (Application No. 106105107) dated Sep. 11, 2017.
Chinese Office Action (Application No. 201711120319.8) dated Sep. 1, 2020.

* cited by examiner

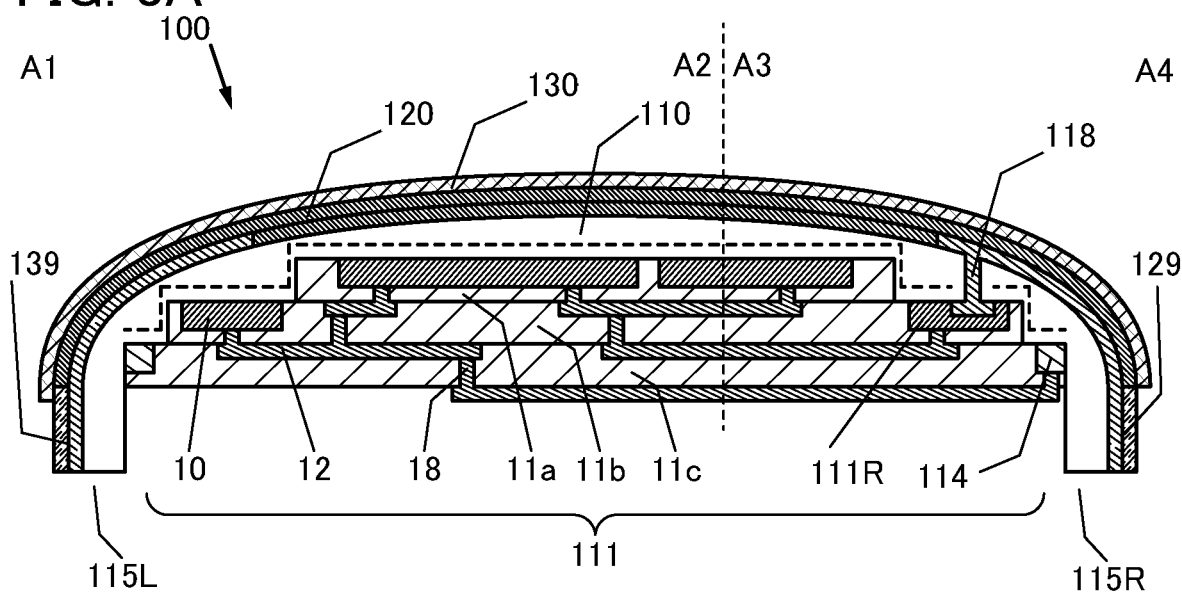
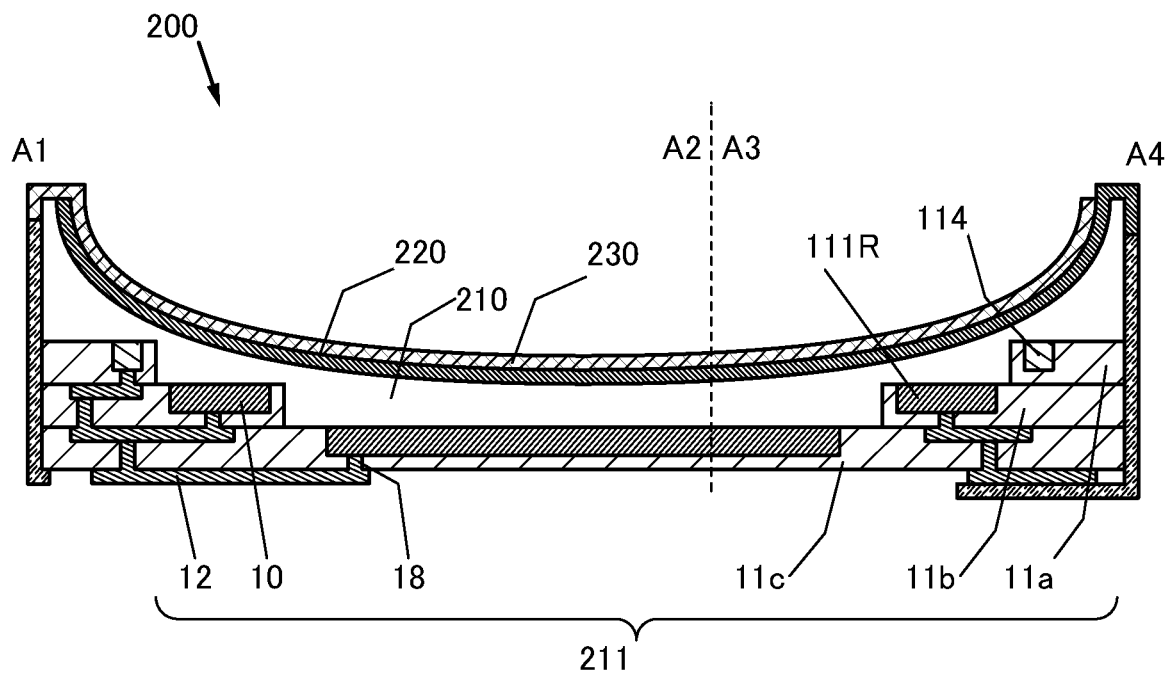

ELECTRONIC DEVICE INCLUDING DISPLAY PANEL

TECHNICAL FIELD

The present invention relates to a display device and an electronic device including the display device. In particular, the present invention relates to a display device including a display panel on a curved surface, and an electronic device including the display device.

BACKGROUND ART

A conventional display panel has a flat shape; thus the external shape of a portion of an object (e.g., a display device or an electronic device) mounted with the display panel, in which the portion is provided with the display panel, has been required to be flat.

In recent years, flexible display panels have been developed (Patent Document 1). The external shape of a flexible display panel is not limited to a flat shape. Thus, the external shape of a portion provided with a flexible display panel of an object mounted with the display panel is not necessarily flat. As a result, the external shape of an object mounted with a flexible display panel can be designed more freely, and for example, a high-value-added design can be applied.

REFERENCE

[Patent Document]
[Patent Document 1] Japanese Published Patent Application No. 2012-28761

DISCLOSURE OF INVENTION

The external shape of a portion provided with a display panel of a display device has been required to be flat. As a result, there is a restriction on the design of the external shape of an object. Further, the volume or the weight of a display device has been increased by provision of a flat portion.

On the other hand, the external shape for providing a flat display panel is not required by the use of a flexible display panel; thus, the volume of a display device is reduced. Consequently, a driving circuit and the like of the display device are required to be efficiently stored by making effective use of the remaining volume.

One embodiment of the present invention is made in view of the foregoing technical background. Thus, an object of the present invention is to provide a display device which has a display panel on a curved surface and whose volume or weight is inhibited from increasing. Further, another object of the present invention is to provide an electronic device which has a display panel on a curved surface and whose volume or weight is inhibited from increasing.

In order to achieve the above object, one embodiment of the present invention is made with a focus on a structure of a curved surface of a base on which a display panel is mounted and a structure of the back of the curved surface. This leads to a display device having a structure exemplified in this specification.

A display device of one embodiment of the present invention includes a display panel mounted on a curved surface, and driver circuits including circuit elements which are mounted on a plurality of plane surfaces provided on the back of the curved surface in a stepwise shape along the curved surface.

That is, one embodiment of the present invention is a display device including a base whose outer surface is formed to have a curved surface, a display panel mounted along the curved surface, a plurality of electronic circuit boards provided on an inner surface of the base having steps so that their heights are increased from a central portion toward an outer region, and a wiring member electrically connecting the electronic circuit boards. The display panel is connected to the electronic circuit board at a side surface portion of the base.

One embodiment of the present invention is a display device including a display panel, driver circuits for driving the display panel, and a base which has a curved surface on which the display panel is mounted and a plurality of plane surfaces provided on the back of the curved surface in a stepwise shape along the curved surface. The driver circuits include circuit elements mounted on the plane surfaces.

The display device of one embodiment of the present invention includes a display panel mounted on a curved surface, and driver circuits including circuit elements mounted on a plurality of plane surfaces provided on the back of the curved surface in a stepwise shape along the curved surface. Thus, a volume that is reduced by provision of the display panel on a curved surface can be effectively used. As a result, a display device which has a display panel on a curved surface and whose volume or weight is inhibited from increasing can be provided.

Further, one embodiment of the present invention is a display device including a base whose outer surface is formed to have a curved surface, a display panel mounted along the curved surface, a plurality of electronic circuit boards on an inner surface of the base having steps so that their heights are increased from a central portion toward an outer region, and a wiring member electrically connecting the electronic circuit boards. The display panel is connected to the electronic circuit board at a side surface portion of the base, and the electronic circuit boards are provided with a plurality of planarization layers and a wiring between the planarization layers.

Further, one embodiment of the present invention is a display device including a display panel, driver circuits for driving the display panel, a base which has a curved surface on which the display panel is mounted and a plurality of plane surfaces provided on the back of the curved surface in a stepwise shape along the curved surface, and a multi-layer substrate in contact with the plane surfaces. The multi-layer substrate includes circuit elements which overlap with the plane surfaces, a planarization layer which planarizes the plurality of plane surfaces provided in a stepwise shape, and a wiring or driver circuits provided over the planarization layer.

The display device of one embodiment of the present invention includes the planarization layer which planarizes the plurality of plane surfaces provided in a stepwise shape, and includes the wiring or the driver circuits provided over the planarization layer. Thus, a volume that is reduced by provision of the display panel on a curved surface can be effectively used. As a result, a display device which has a display panel on a curved surface and whose volume or weight is inhibited from increasing can be provided.

Further, one embodiment of the present invention is a display device including a base whose outer surface is formed to have a curved surface, a display panel mounted along the curved surface, a plurality of electronic circuit boards on an inner surface of the base having steps so that their heights are increased from a central portion toward an outer region, and a wiring member electrically connecting the electronic circuit boards. The display panel is connected to the electronic circuit board at a side surface portion of the base, and the electronic circuit board has a through hole electrically connected to the display panel.

One embodiment of the present invention is a display device including a display panel, driver circuits for driving the display panel, a base which has a curved surface on which the display panel is mounted, a plurality of plane surfaces provided on the back of the curved surface in a stepwise shape along the curved surface. The driver circuits include circuit elements mounted on the plurality of plane surfaces, and the base has a through hole electrically connecting the display panel and the driver circuits.

In the display device of one embodiment of the present invention, the through hole provided in the base electrically connects the driver circuits provided on the back of the base to the display panel provided on the curved surface. Accordingly, a volume that is reduced by provision of the display panel on a curved surface can be effectively used. As a result, a display device which has a display panel on a curved surface and whose volume or weight is inhibited from increasing can be provided.

One embodiment of the present invention is a display device including a base whose outer surface is formed to have a curved surface, a display panel mounted along the curved surface, a plurality of electronic circuit boards on an inner surface of the base having steps so that their heights are increased from a central portion toward an outer region, a wiring member electrically connecting the electronic circuit boards, and a battery for supplying power to the electronic circuits boards. The display panel is connected to the electronic circuit board at a side surface portion of the base.

One embodiment of the present invention is a display device including a display panel, driver circuits for driving the display panel, a base which has a curved surface on which the display panel is mounted and a plurality of plane surfaces provided on the back of the curved surface in a stepwise shape along the curved surface, and a battery for supplying power to the driver circuits. The battery has an external shape along one of the plane surfaces.

The display device of one embodiment of the present invention includes the display panel mounted on a curved surface, and the battery having an external shape along one of the plane surfaces provided on the back of the curved surface in a stepwise shape along the curved surface. Thus, a volume that is reduced by provision of the display panel on a curved surface can be effectively used. As a result, a display device which has a display panel on a curved surface and whose volume or weight is inhibited from increasing can be provided.

One embodiment of the present invention is a display device in which a base is provided with a touch panel in a position overlapping with the display panel.

The display device of one embodiment of the present invention is provided with the touch panel in a position overlapping with the display panel mounted on a curved surface. Accordingly, operation of inputting information to the display device with the use of a region which moves to draw an arc around a joint (e.g., part of body such as a finger, or an indication member held by part of a body) is facilitated. As a result, a display device which includes a display panel on a curved surface, whose volume or weight is inhibited from increasing, and whose operability is improved, can be provided.

One embodiment of the present invention is a display device in which a base includes a metal film between the curved surface and the plurality of plane surfaces.

The display device of one embodiment of the present invention includes the metal film functioning as a shielding film in the base. Thus, a control circuit that is provided for the back of the curved surface mounted with the display panel can be protected from electrical noise and the like from the outside of the display device. Consequently, a display device in which malfunction caused by electrical noise and the like from the outside of the display device is less likely to occur in a driver circuit can be provided.

One embodiment of the present invention is a display device including the display panel on its top surface and a flat portion on its bottom surface.

The display device of one embodiment of the present invention includes the display panel on its top surface and the flat portion on its bottom surface. Thus, the display device can be placed still on a flat area such as on a desk with the bottom surface of the display device down. Consequently, a display device allowing characters and images displayed on the display panel to be easily seen can be provided.

One embodiment of the present invention is an electronic device including any of the above display devices.

The electronic circuit of one embodiment of the present invention is provided with a display device including a display panel mounted on a curved surface and driver circuits including circuit elements which are mounted on a plurality of plane surfaces provided on the back of the curved surface in a stepwise shape along the curved surface. Thus, a volume that is reduced by provision of the display panel on a curved surface can be effectively used. As a result, a display device which has a display panel on a curved surface and whose volume or weight is inhibited from increasing can be provided.

Note that in this specification, an "EL layer" refers to a layer provided between a pair of electrodes in a light-emitting element. Thus, a light-emitting layer containing an organic compound that is a light-emitting substance which is interposed between electrodes is one embodiment of the EL layer.

Note that a display device in this specification refers to an image display device or a light-emitting device. In addition, the display device includes any of the following modules in its category: a module in which a connector such as a flexible printed circuit (FPC) or a tape carrier package (TCP) is attached to a display device; a module having a TCP provided with a printed wiring board at the end thereof; and a module having an integrated circuit (IC) directly mounted over a substrate over which a light-emitting element is formed by a chip on glass (COG) method.

In accordance with one embodiment of the present invention, a display device which has a display panel on a curved surface and whose volume or weight is inhibited from increasing can be provided. Alternatively, an electronic device which has a display panel on a curved surface and whose volume or weight is inhibited from increasing can be provided.

BRIEF DESCRIPTION OF DRAWINGS

FIGS. 3A and 3B illustrate structures of display devices each including a display panel on a curved surface according to one embodiment of the present invention.

BEST MODE FOR CARRYING OUT THE INVENTION

Figure 1A:
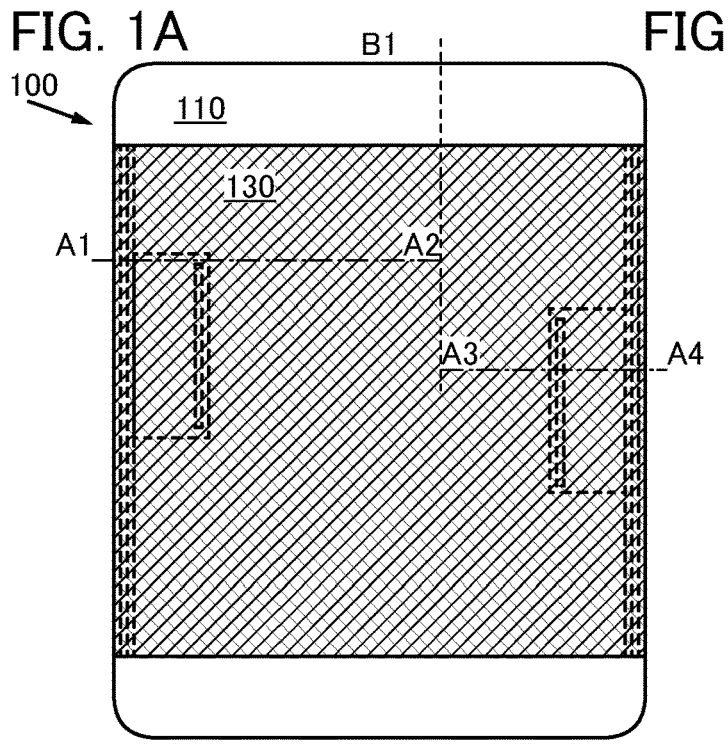
FIGS. 1A to 1D illustrate a structure of a display device including a display panel on a convex curved surface according to one embodiment of the present invention.

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a structure of a display device including a display panel on a convex curved surface of one embodiment of the present invention is described with reference to FIGS. 1A to 1D.

Figure 1B:
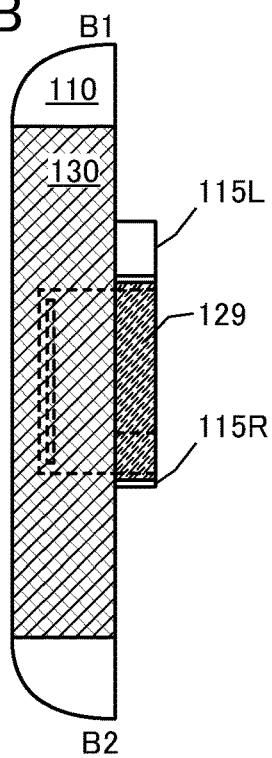
Figure 1C:
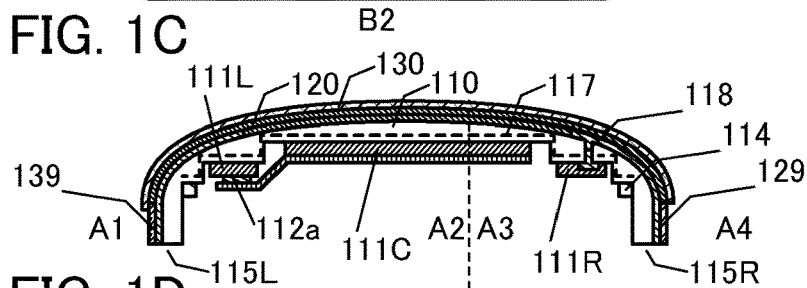
Figure 1D:
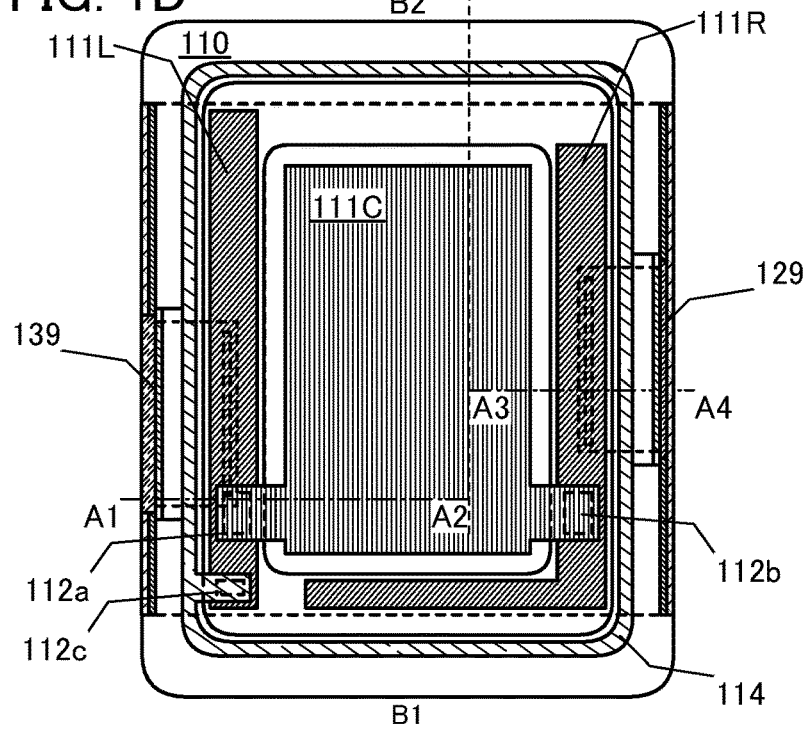

FIG. 1A is a top view of a display device 100 of one embodiment of the present invention. FIG. 1B is a side view of the display device 100. FIG. 1C illustrates a cross-sectional structure of the display device 100 taken along dashed-dotted line A1-A2 and dashed-dotted line A3-A4. FIG. 1D is a bottom view of the display device 100.

The display device 100 exemplified in this embodiment is a display device including a base 110 whose outer surface is formed to have a curved surface, a display panel 120 mounted along the curved surface, a plurality of electronic circuit boards (e.g., a first printed board 111C, a printed board provided with a driver circuit 111R, and a second printed board 111L) on an inner surface of the base 110 having steps so that their heights are increased from a central portion toward an outer region, and wiring members (a connector 112a and a connector 112b) electrically connecting the electronic circuit boards. The display panel 120 is connected to the electronic circuit board (e.g., the printed board provided with the driver circuit 111R) at a side surface portion of the base 110.

Alternatively, the display device 100 exemplified in this embodiment includes the display panel 120, the driver circuit 111R for driving the display panel 120, and the base 110 which has a curved surface on which the display panel 120 is mounted and on the back of the curved surface, a plurality of plane surfaces provided in a stepwise shape along the curved surface. Further, the driver circuit 111R includes circuit elements mounted on the plane surfaces.

The display device 100 exemplified in this embodiment includes a light-transmitting touch panel 130 over the display panel 120 (see FIGS. 1A to 1C). By the structure in which the touch panel 130 is provided over the display panel 120, coordinates of an image displayed on the display panel 120 can be easily compared with coordinates input from the touch panel 130.

Further, the display panel 120 extends to the curved surface leading to side surfaces from the top surface of the base 110 (see FIG. 1C). With this structure, image displayed on the display device 100 can be observed not only from the top surface but also from the side surfaces.

The base 110 is provided with a terminal portion 115R and a terminal portion 115L on the front side and on the back side of the sheet in FIG. 1B, respectively.

A plurality of terminals is provided for the terminal portion 115R. The plurality of terminals is electrically connected to a flexible printed board 129 of the display panel 120.

A plurality of terminals is provided for the terminal portion 115L. The plurality of terminals is electrically connected to a flexible printed board 139 of the touch panel 130.

On the back of the curved surface of the base 110, a plurality of plane surfaces is provided in a stepwise shape along the curved surface. For example, the base 110 is provided with three plane surfaces in a stepwise shape. In particular, the base 110 is provided with a plane surface with the first printed board 111C, a plane surface with a second printed board 111L and a printed board provided with the driver circuit 111R, and a plane surface with an antenna 114 (see FIGS. 1C and 1D).

The first printed board 111C is electrically connected to the second printed board 111L through the connector 112a and is electrically connected to the driver circuit 111R through the connector 112b (see FIG. 1D).

The display device 100 exemplified in this embodiment includes the display panel 120 mounted on the curved surface and on the back of the curved surface, the driver circuit 111R including the circuit elements mounted on the plurality of plane surfaces provided in a stepwise shape along the curved surface. Accordingly, a small volume that is obtained by provision of the display panel 120 on a curved surface can be effectively used. As a result, the display device 100 which includes the display panel 120 on the curved surface and whose volume or weight is inhibited from increasing can be provided.

Elements included in the display device of one embodiment of the present invention will be described below.

《Display Panel》

The display panel 120 is connected to the flexible printed board 129 to which image data is supplied from the driver circuit 111R and is provided with a display portion on a curved surface. The display portion includes a plurality of pixels and image data supplied through the flexible printed board is displayed on each pixel.

The display panel 120 provided with the display portion on a curved surface is formed in such a manner that, for example, a flexible display panel is fixed to a curved surface of a support with the curved surface.

As a method for mounting the flexible display panel on the curved surface of the base 110, a method in which an adhesive layer or a sticking layer is used or a method in which a light-transmitting housing for covering the curved surface of the base 110 is prepared and the flexible display panel is interposed between the base 110 and the housing may be employed.

Each pixel included in the display portion of the display panel 120 includes a display element. For the display element, a variety of known display elements in addition to an electroluminescence element (also referred to as an EL element) in which a layer containing a light-emitting organic compound is interposed between a pair of electrodes, a liquid crystal display element, and an electrophoretic display element can be used.

《 Driver Circuit 》

The display panel 120 is driven by the driver circuit 111R. For example, image data is generated by the first printed board 111C and is outputted to the driver circuit 111R through the connector 112b. The driver circuit 111R transmits the image data to a plurality of pixels provided in the display panel 120 and each pixel is driven in accordance with the image data.

《 Base 》

The base 110 has an insulating property. Further, the base 110 has a curved surface as one of surfaces and on the back of the curved surface, a plurality of plane surfaces provided in a stepwise shape along the curved surface. The base 110 can be formed, for example, by formation of an engineering plastic using a mold. Alternatively, the base 110 may be formed using a multi-layer substrate in which dry films are stacked.

《 Printed Board 》

The first printed board 111C, the printed board provided with the driver circuit 111R, and the second printed board 111L each includes a circuit element and a wiring, and each of the printed boards is one embodiment of an electronic circuit board. Examples of the circuit element include an LSI chip, a capacitor, a coil, an antenna, and the like.

Note that in the case of using the display device 100 for part of an electronic device, a variety of circuits such as the driver circuit 111R of the display panel, the driver circuit of the touch panel 130, and a transmission/reception circuit for signal communication with an external information device can be provided for the printed board.

《 Wiring Member 》

The connector 112a electrically connects the first printed board 111C and the second printed board 111L, and the connector 112b electrically connects the first printed board 111C and the driver circuit 111R. Each of the connector 112a and the connector 112b is a wiring member which electrically connects the electronic circuit boards.

Further, the base 110 included in the display device 100 is provided with a through hole 118 that electrically connects the display panel 120 and the driver circuit 111R.

The base 110 is provided with a plurality of through holes penetrating between the curved surface and the plane surfaces provided in a stepwise shape. A conductive film for electrically connecting the plane surfaces provided in a stepwise shape and the curved surface is formed on a wall surface of the through hole.

For example, the through hole 118 is a hole that penetrates between the plane surface provided with the driver circuit 111R and the curved surface, and a conductive film provided for the through hole 118 electrically connects the driver circuit 111R and the terminals provided for the terminal portion 115R (see FIG. 1C). With this structure, the driver circuit 111R provided over the plane surfaces in a stepwise shape of the base 110 can output to the display panel 120 a signal for driving the display panel 120 through the terminals provided over the curved surface of the base 110 and the flexible printed board 129.

Further, the touch panel 130 is provided over the curved surface of the base 110 so as to overlap with the display panel 120. The touch panel 130 is electrically connected to the flexible printed board 139, and the flexible printed board 139 is electrically connected to the terminal portion 115L. With this structure, the touch panel 130 can output a detected signal to the second printed board 111L provided over the plane surface in a stepwise shape of the base 110 through the terminal portion 115L and a through hole (not shown).

In the display device 100 exemplified in this embodiment, the through hole 118 provided for the base 110 electrically connects the display panel 120 provided over the curved surface and the driver circuit 111R provided over the back of the curved surface. Accordingly, a small volume that is obtained by provision of the display panel 120 on the curved surface can be effectively used. As a result, the display device 100 which includes the display panel 120 on the curved surface and whose volume or weight is inhibited from increasing can be provided.

The base 110 included in the display device 100 can include a metal film 117 provided between the curved surface and the plurality of plane surfaces (see FIG. 1C).

In the display device 100 exemplified in this embodiment, a metal film functioning as a shielding film is included in the base 110. Thus, a control circuit that is provided for the back of the curved surface on which the display panel is mounted can be protected from electrical noise and the like from the outside of the display device. Consequently, a display device in which malfunction caused by electrical noise and the like from the outside of the display device is less likely to occur in the driver circuit can be provided.

As the metal film functioning as a shielding film, aluminum, copper, brass, or the like can be used. Note that when the conductive film is provided on a wall surface of the through hole 118, the metal film 117 is not provided around the through hole 118. This is because a short circuit between the metal film 117 and the conductive film provided on the wall surface of the through hole 118 is prevented.

Modification Example

As a modification example of the display device of one embodiment of the present invention exemplified in this embodiment, a structure of a display device including a display panel on a concave curved surface is described with reference to FIGS. 2A to 2D.

Figure 2A:
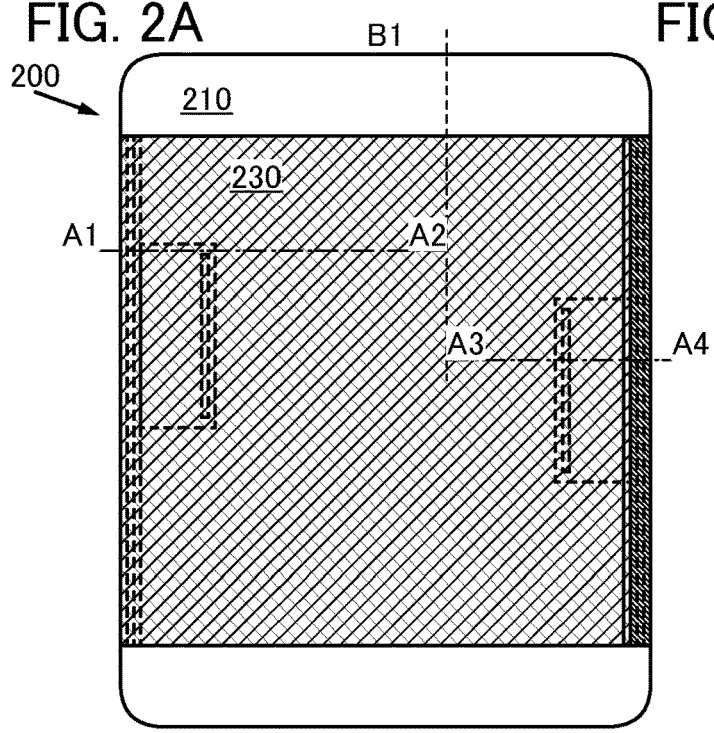
FIGS. 2A to 2D illustrate a structure of a display device including a display panel on a concave curved surface according to one embodiment of the present invention.
Figure 2B:
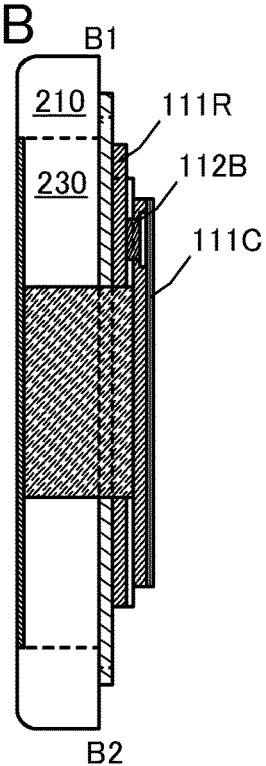
Figure 2C:
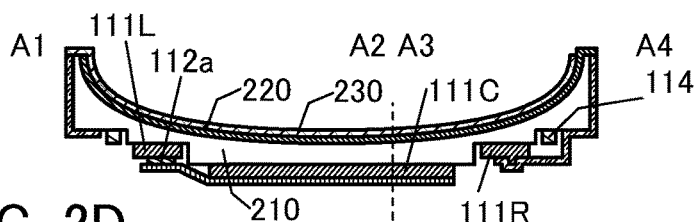
Figure 2D:
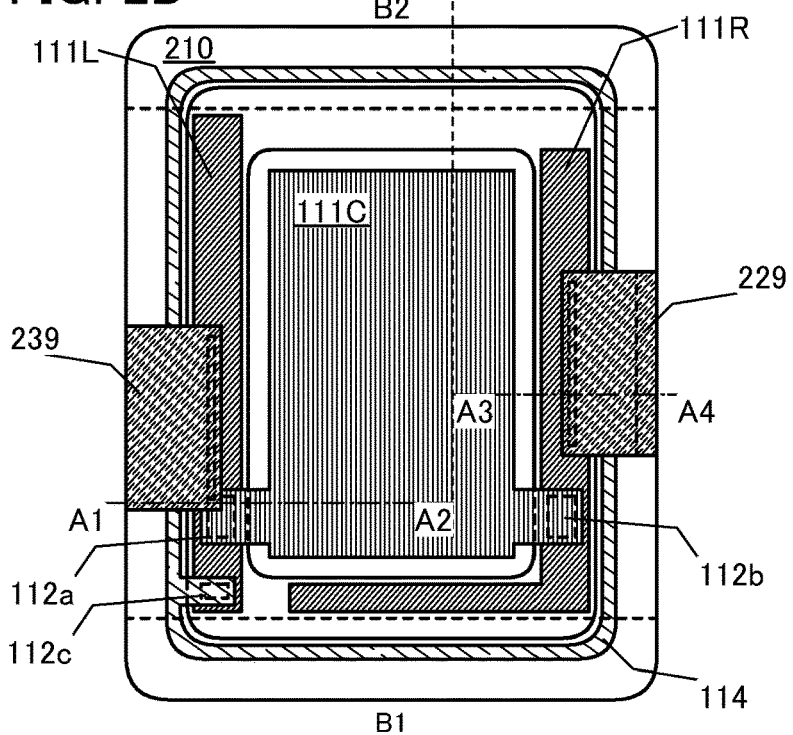

FIG. 2A is a top view of a display device 200 of one embodiment of the present invention. FIG. 2B is a side view of the display device 200. FIG. 2C illustrates a cross-sectional structure of the display device 200 taken along dashed-dotted line A1-A2 and dashed-dotted line A3-A4. FIG. 2D is a bottom view of the display device 200.

The display device 200 described in FIGS. 2A to 2D is different from the display device 100 described in FIGS. 1A to 1D in having a concave curved surface.

The display device 200 exemplified in this embodiment includes a display panel 220, the driver circuit 111R for driving the display panel 220, and a base 210 having a curved surface on which the display panel 220 is mounted and on the back of the curved surface, a plurality of plane surfaces provided in a stepwise shape along the curved surface. Further, the driver circuit 111R includes circuit elements mounted on the plane surfaces.

The display device 200 exemplified in this embodiment includes a light-transmitting touch panel 230 over the display panel 220 (see FIGS. 2A to 2C). By the structure in which the touch panel 230 is provided over the display panel 220, coordinates of an image displayed on the display panel 220 can be easily compared with coordinates input from the touch panel 230.

On the back of the curved surface of the base 210, the plurality of plane surfaces is provided in a stepwise shape along the concave curved surface. For example, the base 210 is provided with three plane surfaces. In particular, the base 210 is provided with a plane surface with the first printed board 111C, a plane surface with the second printed board 111L and a printed board provided with the driver circuit 111R, and a plane surface with the antenna 114 (see FIGS. 2C and 2D).

The first printed board 111C is electrically connected to the second printed board 111L through the connector 112a and is electrically connected to the driver circuit 111R through the connector 112b (see FIG. 2D).

Further, the base 210 included in the display device 200 is provided with the touch panel 230 on the concave curved surface so as to overlap with the display panel 220.

The display device 200 exemplified in this embodiment is provided with the touch panel 230 in a position overlapping with the display panel 220 that is mounted on the curved surface of the base 210. Accordingly, operation of inputting information to the display device with the use of a region which moves to draw an arc around a joint (e.g., part of body such as a finger, or an indication member held by part of body) is facilitated. As a result, a display device which includes a display panel on a curved surface, whose volume or weight is inhibited from increasing, and whose operability is improved can be provided.

This embodiment can be freely combined with any of the other embodiments in this specification.

Embodiment 2

In this embodiment, a structure of a display device of one embodiment of the present invention is described with reference to FIGS. 3A and 3B.

FIG. 3A illustrates a cross-sectional structure of the display device 100 including a display panel on a convex curved surface of one embodiment of the present invention, which is described in Embodiment 1, taken along dashed-dotted line A1-A2 and dashed-dotted line A3-A4.

The display device 100 in FIG. 3A exemplified in this embodiment is a display device including the base 110 whose outer surface is formed to have a curved surface, the display panel 120 mounted along the curved surface, the plurality of electronic circuit boards on an inner surface of the base 110 having steps so that their heights are increased from a central portion toward an outer region (e.g., the first printed board 111C, the printed board provided with the driver circuit 111R, and the second printed board 111L), and wiring members (the connector 112a and the connector 112b) electrically connecting the electronic circuit boards. The display panel 120 is connected to the electronic circuit board (e.g., the printed board provided with the driver circuit 111R) at a side surface of the base 110, and the electronic circuit boards are provided with a plurality of planarization layers and wirings each between the planarization layers.

Alternatively, the display device 100 in FIG. 3A exemplified in this embodiment includes the display panel 120, the driver circuit 111R for driving the display panel 120, the base 110 which has a curved surface on which the display panel 120 is mounted and on the back of the curved surface, a plurality of plane surfaces provided in a stepwise shape along the curved surface, and a multi-layer substrate 111 in contact with the plane surfaces. The multi-layer substrate 111 includes a circuit element 10 overlapping with the plane surface, planarization layers which planarize the plurality of plane surfaces provided in a stepwise shape (e.g., a planarization layer 11a, a planarization layer 11b, and a planarization layer 11c), and a wiring 12 or the driver circuit 111R provided over the planarization layers.

The display device 100 exemplified in this embodiment includes the planarization layers which planarize the plurality of plane surfaces provided in a stepwise shape (e.g., the planarization layer 11a, the planarization layer 11b, and the planarization layer 11c), and the wiring 12 or the driver circuit 111R provided over the planarization layers. Accordingly, a small volume that is obtained by provision of the display panel 120 on the curved surface can be effectively used. Thus, the display device 100 which has the display panel 120 on a curved surface and whose volume or weight is inhibited from increasing can be provided.

Elements included in the display device of one embodiment of the present invention will be described below.

⟨⟨ Multi-Layer Substrate ⟩⟩

The multi-layer substrate 111 includes a plurality of planarization layers, and includes the circuit element 10, the wiring 12, or a function circuit such as the driver circuit 111R.

The planarization layers have insulating properties, and are layers which planarize steps caused by the plurality of plane surfaces provided in a stepwise shape, the circuit element 10 provided so as to overlap with the plane surfaces, and the like. The planarization layers are formed using an insulating material, and over the planarization layers, the antenna 114, the circuit element 10, or various function circuits (e.g., the driver circuit 111R and the like) and a wiring electrically connecting these are provided.

An example of a material applicable to the planarization layers includes an insulating resin. Specifically, polyimide, acrylic, or the like can be used.

Further, the through hole 18 provided with a conductive film on its wall surface may be formed in the planarization layer. The through hole 18 provided with a conductive film on its wall surface can be electrically connecting the wirings 12 provided for different planarization layers.

As a method for forming a through hole in an insulating resin, besides a method for perforating the insulating resin by a laser or the like, a method in which a photolithography method is applied to a photosensitive resin, or the like can be employed. Further, as a method for forming a conductive film on a side surface of the through hole, plating, electroforming, or the like can employed.

Modification Example

As a modification example of the display device of one embodiment of the present invention exemplified in this embodiment, a structure of a display device including a display panel on a concave curved surface is described with reference to FIG. 3B.

FIG. 3B illustrates a cross-sectional structure of the display device 200 including a display panel on a concave curved surface of one embodiment of the present invention, which is described in Embodiment 1, taken along dashed-dotted line A1-A2 and dashed-dotted line A3-A4.

The display device 200 described in FIG. 3B is different from the display device 100 in FIG. 3A in having a concave curved surface.

This embodiment can be freely combined with any of the other embodiments in this specification.

Embodiment 3

In this embodiment, a structure of a display device including a display panel on a convex curved surface of one embodiment of the present invention is described with reference to FIGS. 4A to 4C.

Figure 4A:
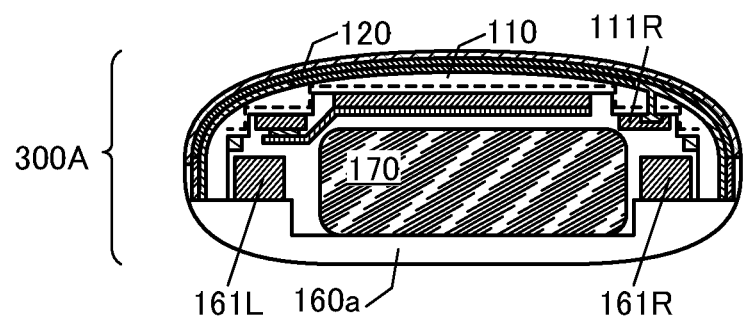
FIGS. 4A to 4C each illustrate a display device including a display panel on a convex curved surface according to one embodiment of the present invention.

A display device 300A in FIG. 4A which includes a display panel on a convex curved surface of one embodiment of the present invention is different from the display device 100 described in Embodiment 1 in being provided with a housing 160a for storing a battery on the back of the display device 300A.

The display device 300A exemplified in this embodiment includes the base 110 whose outer surface is formed to have a curved surface, the display panel 120 mounted along the curved surface, the plurality of electronic circuit boards on an inner surface of the base 110 having steps so that their heights are increased from a central portion toward an outer region, the wiring members electrically connecting the electronic circuit boards, and a battery 170 for supplying power to the electronic circuit boards. The display panel is connected to the electronic circuit board at a side surface of the base.

Alternatively, the display device 300A exemplified in this embodiment includes the display panel 120, the driver circuit 111R for driving the display panel 120, the base 110 having a curved surface on which the display panel 120 is mounted and on the back of the curved surface, a plurality of plane surfaces provided in a stepwise shape along the curved surface, and the battery 170 for supplying power to the driver circuit 111R. The battery 170 has an external shape along one of the plane surfaces.

The display device 300A exemplified in FIG. 4A includes the housing 160a, and the housing 160a includes a convex curved surface and on the back of the curved surface, a plurality of plane surfaces provided in a stepwise shape along the curved surface.

Between the base 110 and plane surfaces provided in a stepwise shape of the housing 160a, the battery 170, and a control circuit 161L and a function circuit 161R of the battery 170 are provided.

The display device 300A of one embodiment of the present invention includes the display panel 120 mounted on a curved surface and the battery 170 having an external shape along one of the plane surfaces provided on the back of the curved surface in a stepwise shape along the curved surface. Accordingly, a small volume that is obtained by provision of the display panel 120 on the curved surface can be effectively used. Thus, the display device which has the display panel 120 on a curved surface and whose volume or weight is inhibited from increasing can be provided.

Further, the display device 300A has the display panel on its top surface, and a flat portion on its bottom surface. Thus, the display device 300A can be placed still on a flat area such as on a desk with the bottom surface thereof down. Consequently, a display device allowing characters and images displayed on the display panel to be easily seen can be provided.

Elements included in the display device 300A of one embodiment of the present invention will be described below.

《Battery》

For the battery, in addition to a dry battery, a secondary battery (e.g., a lithium-ion battery, a nickel-hydride battery, or the like) or the like can be used.

《Control Circuit of Battery》

The control circuit 161L controls the battery 170. For example, the control circuit 161L controls the battery 170 so that the battery 170 supplies power depending on the usage of the display device 300A. When a secondary battery is applied to the battery 170, the control circuit 161L monitors the battery 170 so that the battery 170 is not overcharged. In addition, use history is stored so that charge operation is performed under optimum conditions in accordance with the information.

Modification Example 1

Figure 4B:
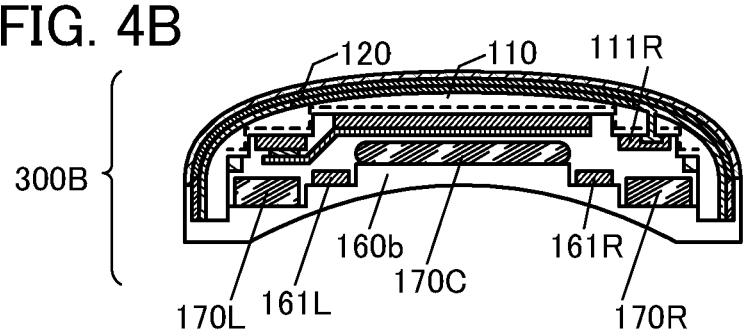

A modification example in FIG. 4B of the display device of one embodiment of the present invention is different from the display device 300A in FIG. 4A in that a concave curved surface of a housing 160b is on the back of a display device 300B.

The display device 300B in FIG. 4B includes the housing 160b having a concave curved surface and a plurality of plane surfaces provided on the back of the curved surface in a stepwise shape along the curved surface.

Between the base 110 and the plane surfaces provided in a stepwise shape of the housing 160b, batteries 170L, 170C, and 170R, and the control circuit 161L and the functional circuit 161R of the batteries are provided. A small volume that is obtained by provision of the display panel 120 on the curved surface of the display device 300B can be effectively used by the structure in which the plurality of thin batteries is provided.

Modification Example 2

Figure 4C:
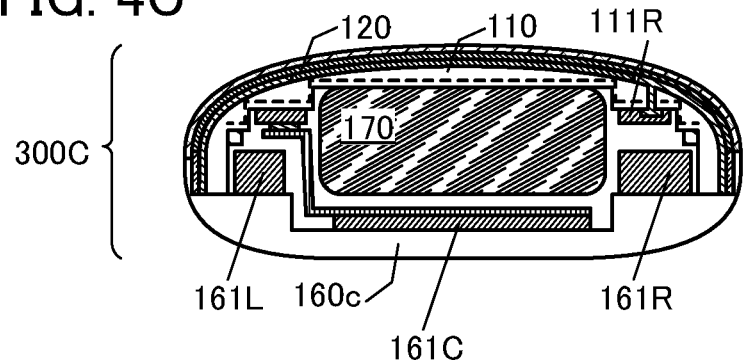

A modification example in FIG. 4C of the display device of one embodiment of the present invention is different from the display device 300A in FIG. 4A in that the battery 170 is mounted on the base 110 and that a printed board 161C is mounted on a housing 160c.

The display device 300C in FIG. 4C includes the housing 160c, and the housing 160c has a convex curved surface and on the back of the curved surface, a plurality of plane surfaces provided in a stepwise shape along the curved surface.

The battery 170, and the control circuit 161L and the functional circuit 161R of the battery 170 are provided between the base 110 and the plane surfaces provided in a stepwise shape of the housing 160c.

Modification Example 3

Figure 5A:
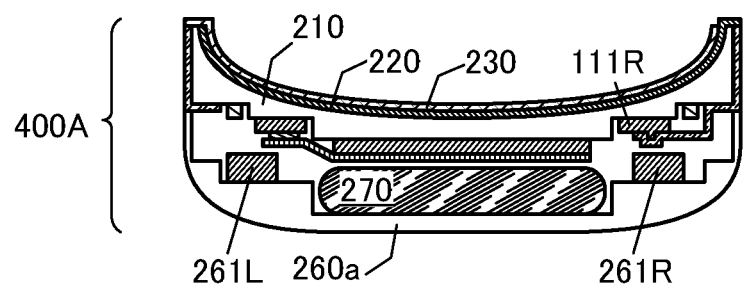
FIGS. 5A to 5C each illustrate a display device including a display panel on a concave curved surface according to one embodiment of the present invention.

A modification example in FIG. 5A of the display device of one embodiment of the present invention is different from the display device 200 described in Embodiment 1 in that a housing 260a for storing a battery is on the back of the display device.

A display device 400A described in this embodiment includes the display panel 220, the driver circuit 111R for driving the display panel 220, the base 210 having a curved surface on which the display panel 220 is mounted and on the back of the curved surface, a plurality of plane surfaces provided in a stepwise shape along the curved surface, and a battery 270 for supplying power to the driver circuit 111R. The battery 270 has an external shape along one of the plane surfaces.

The display device 400A in FIG. 5A includes the housing 260a, and the housing 260a has a convex curved surface and on the back of the curved surface, a plurality of plane surfaces provided in a stepwise shape along the curved surface.

The battery 270, and a control circuit 261L and a functional circuit 261R of the battery 270 are provided between the base 210 and the plane surfaces provided in a stepwise shape of the housing 260a.

Modification Example 4

Figure 5B:
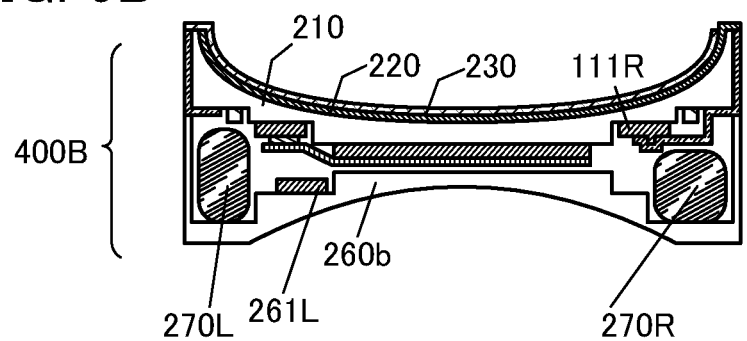

A modification example in FIG. 5B of the display device of one embodiment of the present invention is different from the display device 400A in FIG. 5A in that a housing 260b for storing a battery has a concave curved surface on the back of a display device 400B and that a plurality of batteries is provided.

The display device 400B in FIG. 5B includes the housing 260b having a concave curved surface and on the back of the curved surface, a plurality of plane surfaces provided in a stepwise shape along the curved surface.

Batteries 270L and 270R, and the control circuit 261L and the functional circuit 261R of the batteries are provided between the base 210 and the plane surfaces provided in a stepwise shape of the housing 260b. A small volume that is obtained by provision of the display panel 220 on the curved surface of the display device 400B can be effectively used by the structure in which the plurality of thin batteries is provided.

Modification Example 5

Figure 5C:
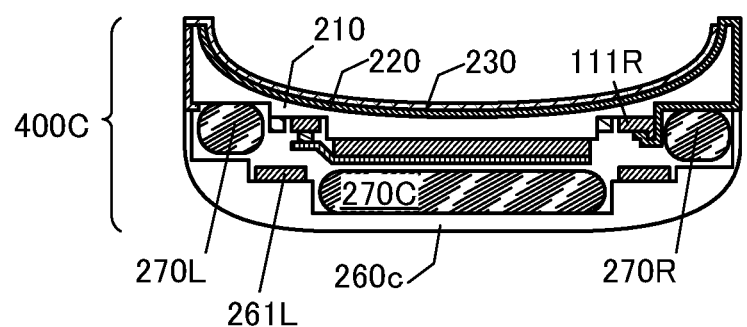

A modification example in FIG. 5C of the display device of one embodiment of the present invention is different from the display device 400A in FIG. 5A in that the batteries 270L and 270R are provided on the base 210 side and a battery 270C is provided on the housing 260b side.

The display device 400C in FIG. 5C includes a housing 260c, and the housing 260c has a convex curved surface and on the back of the curved surface, a plurality of plane surfaces provided in a stepwise shape along the curved surface.

Between the base 210 and the plane surfaces provided in a stepwise shape of the housing 260c, the batteries 270L and 270R are provided on the base 210 side and the battery 270C is provided on the housing 260b side.

This embodiment can be freely combined with any of the other embodiments in this specification.

Embodiment 4

In this embodiment, a structure of a display device including a display panel on a convex curved surface of one embodiment of the present invention is described with reference to FIGS. 6A and 6B.

Figure 6A:
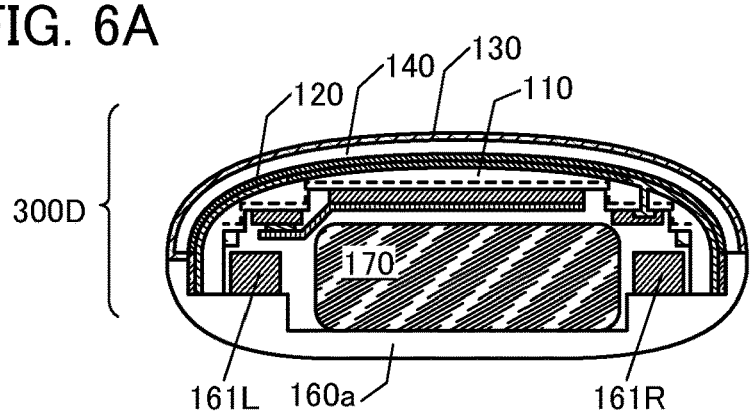
FIGS. 6A and 6B illustrate a display device including a display panel on a convex curved surface according to one embodiment of the present invention.
Figure 6B:
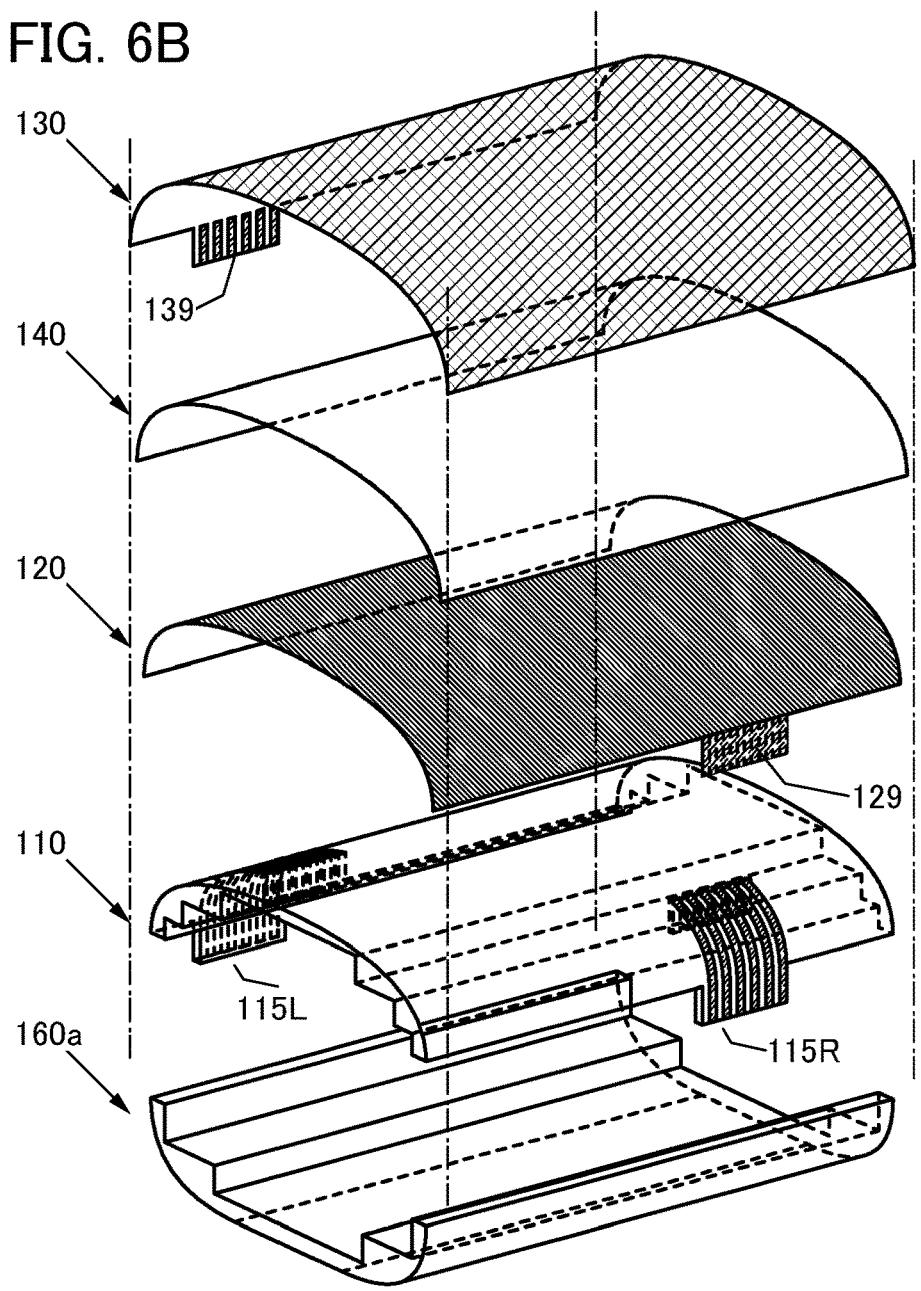

FIG. 6A illustrates a cross-sectional structure of a display device 300D of one embodiment of the present invention. FIG. 6B illustrates a perspective view illustrating overlap of components of the display device 300D.

The display device 300D is different from the display device 300A described in Embodiment 3 in that a light-transmitting spacer 140 with a curved surface is provided between the display panel 120 and the touch panel 130.

The display device 300D exemplified in this embodiment includes the display panel 120, the driver circuit 111R for driving the display panel 120, the base 110 having a curved surface on which the display panel 120 is mounted and on the back of the curved surface, a plurality of plane surfaces provided in a stepwise shape along the curved surface, and the battery 170 for supplying power to the driver circuit 111R. The battery 170 has an external shape along one of the plane surfaces.

The display device 300D includes the housing 160a, and the housing 160a includes a convex curved surface and on the back of the curved surface, a plurality of plane surfaces provided in a stepwise shape along the curved surface.

The control circuit 161L and the functional circuit 161R of the battery 170, and the battery 170 are provided between the base 110 and the plane surfaces provided in a stepwise shape of the housing 160a.

Further, the display device 300D includes the light-transmitting spacer 140 between the display panel 120 and the touch panel 130. Note that the spacer 140 may be integrally formed with the touch panel 130.

The spacer 140 keeps the touch panel 130 at a distance from the display panel 120. This structure can reduce the influence of the display panel 120 on the touch panel 130 and prevent reduction in the sensitivity of the touch panel 130.

A structure may be employed in which the spacer 140 is formed along the curved surface of the base 110 so that the spacer 140 and the base 110 fit to each other and the display panel 120 which has flexibility is provided therebetween.

Further, a ceramic coat layer or a hard coat layer may be formed on a surface of the touch panel 130 of the display device 300D. Furthermore, a ceramic coat layer or a hard coat layer may be formed on the back of the display device 300D.

A circularly polarizing plate may be provided on a viewer side of the display panel 120 or a viewer side of the touch panel 130; alternatively, the circularly polarizing plate may be used for the spacer 140. The problem of a decrease in contrast due to external light reflected by the display panel 120 or the touch panel 130 can be solved by provision of the circularly polarizing plate.

This embodiment can be freely combined with any of the other embodiments in this specification.

Embodiment 5

In this embodiment, a structure of a display device including a display panel on a concave curved surface of one embodiment of the present invention is described with reference to FIGS. 7A and 7D.

Figure 7A:
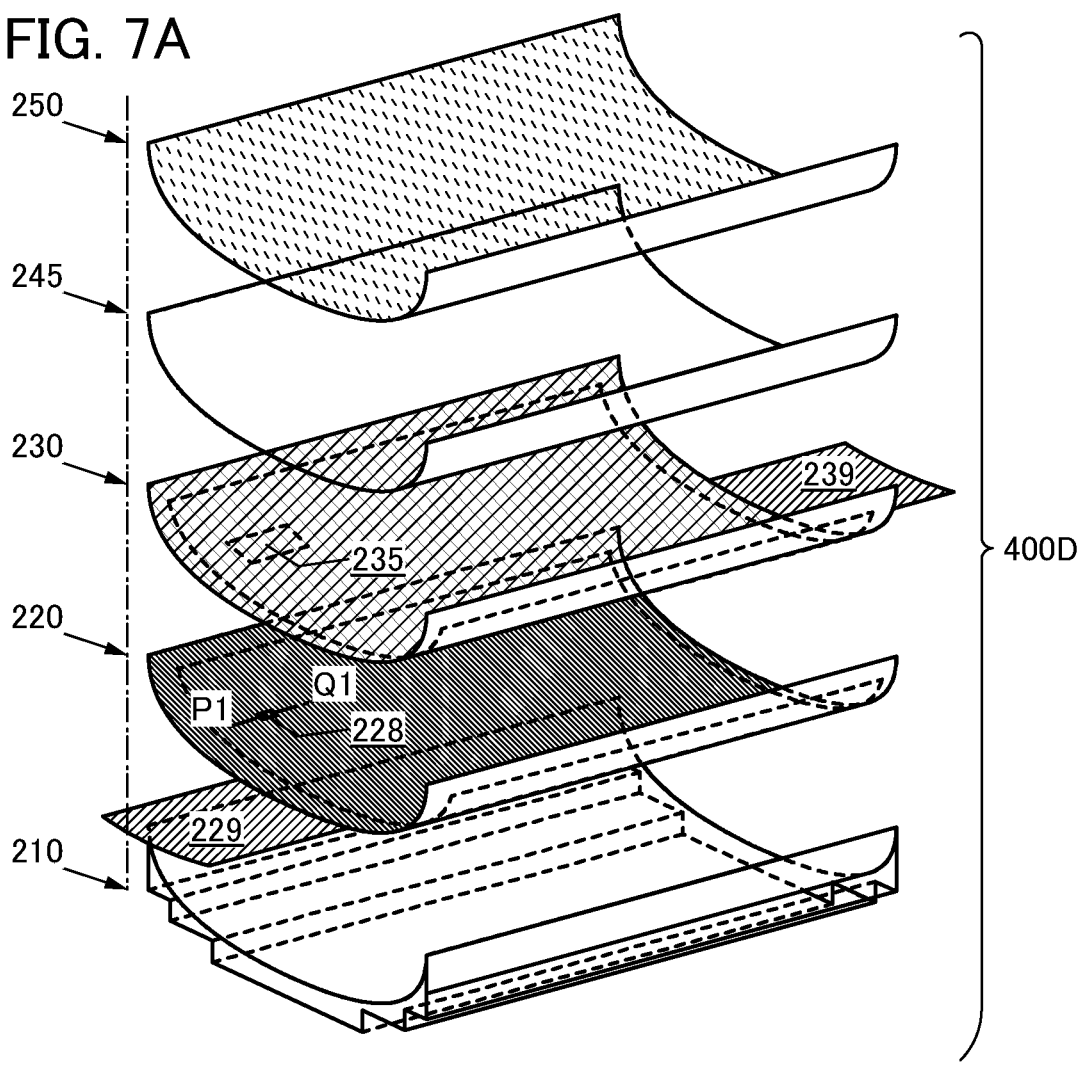
FIGS. 7A to 7D illustrate a display device including a display panel on a concave curved surface according to one embodiment of the present invention.
Figure 7B:
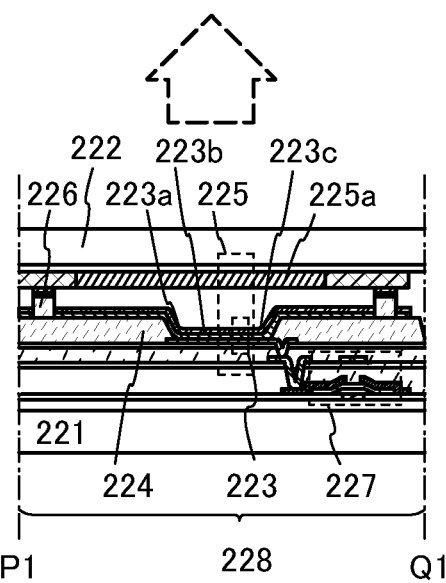

FIG. 7A is a perspective view illustrating a structure of a display device 400D. FIG. 7B is an example of a cross section of a pixel portion taken along line P1-Q1 of a display panel applicable to the display device 400D.

Figure 7C:
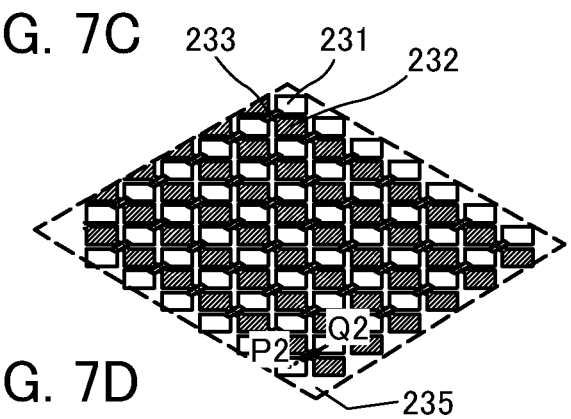
Figure 7D:
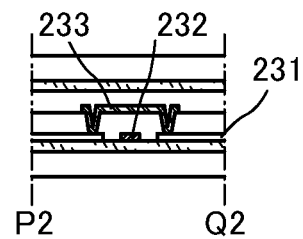

FIG. 7C is a perspective view of a structure of a touch panel applicable to the display device 400D. FIG. 7D illustrates a cross-sectional structure taken along line P2-Q2 of the touch panel.

The display device 400D is different from the display device 300D described in Embodiment 4 in having a concave curved surface and including the display panel 220, the touch panel 230, a cover 245, and a circularly polarizing plate 250 in this order.

The display device 400D exemplified in this embodiment includes the display panel 220, and the base 210 having a curved surface on which the display panel 220 is mounted and on the back of the curved surface, a plurality of plane surfaces provided in a stepwise shape along the curved surface.

The display device 400D includes the display panel 220, the touch panel 230, the cover 245, and the circularly polarizing plate 250 in this order.

For example, the display panel 220 which includes a display element including a layer containing a light-emitting organic compound and which is flexible can have a thickness of about 50 μm; the touch panel 230 integrally formed with a spacer can have a thickness of about 400 μm; the cover 245 can have a thickness of about 500 μm; and the circularly polarizing plate 250 can have a thickness of about 300 μm.

<Display Panel>

The display panel 220 includes a display portion in a region surrounded by a dashed line in FIG. 7A. In the display portion, a plurality of pixels 228 is arranged in matrix. Each pixel 228 includes a display element. Examples of the display element applicable to the pixel 228 include an electroluminescence element (also referred to as an EL element) in which a layer containing a light-emitting organic compound is interposed between a pair of electrodes, a liquid crystal display element, an electrophoretic display element, and a variety of known display elements.

Further, a flexible printed board 229 is provided on the display panel 220. The flexible printed board 229 is electrically connected to a driver circuit that is not shown and supplies a signal for driving the display panel 220 to the display portion.

FIG. 7B illustrates an example of a structure of the pixel 228 applicable to an active matrix display panel. The pixel 228 includes a transistor 227, an EL element 223 which is electrically connected to a source electrode or a drain electrode of the transistor 227, and a color filter 225a which overlaps with the EL element 223.

⟨⟨ Substrate ⟩⟩

The display panel 220 includes a first substrate 221 positioned on the base 210 side and a second substrate 222 positioned on a viewer side. The pixel 228 is sealed between the first substrate 221 and the second substrate 222. Note that both the first substrate 221 and the second substrate 222 have flexibility and the display panel 220 also has flexibility.

The materials for the first substrate 221 and the second substrate 222 are selected such that thermal expansion coefficients of the first substrate 221 and the second substrate 222 are approximately the same. The first substrate 221 and the second substrate 222 having approximately the same thermal expansion coefficients, a problem such that the flexible display panel 220 is curled can be prevented.

In the case of using an EL element for the display element, a substrate with excellent gas barrier properties is used for each of the first substrate 221 and the second substrate 222. A substrate whose gas barrier properties are improved by formation of a film with excellent gas barrier properties may be used.

⟨⟨ Transistor ⟩⟩

The transistor 227 includes a semiconductor layer. As the transistor 227, a known semiconductor such as amorphous silicon, low temperature polysilicon, or an oxide semiconductor can be used.

A back gate electrode can be provided for the transistor 227. The threshold value of the transistor 227 may be controlled by the use of the back gate electrode.

⟨⟨ EL Element ⟩⟩

The EL element 223 includes a first electrode 223a, a second electrode 223c, and a layer 223b containing a light-emitting organic compound between the first electrode 223a and the second electrode 223c.

The color of light emitted from the EL element 223 can be adjusted by selection of a material used for the layer 223b containing a light-emitting organic compound. The EL element 223 in this embodiment emits white light.

⟨⟨ Color Filter ⟩⟩

The color filter 225a selectively transmits light with a desired color from white light emitted from the EL element. A structure in which the color filter 225a is provided so as to overlap with the EL element 223 which emits white light is referred to as a light-emitting module 225.

The first electrode 223a of the EL element has end portions covered with a partition 224 and overlaps with an opening of the partition 224.

A spacer 226 is provided over the partition 224 and adjusts a gap between the EL element 223 and the color filter 225a.

⟨⟨ Sealing Structure ⟩⟩

The display element is sealed between the first substrate 221 and the second substrate 222 which are attached to each other by a sealing material that is not shown.

The light-emitting element 223 and the color filter 225a may be bonded to each other using a light-transmitting adhesive.

As the sealing material, a material having low moisture permeability is preferable. In the case of using an EL element as the display element, an inorganic material such as low-melting-point glass is preferably used for the sealing material.

⟨⟨ Method for Manufacturing Display Panel ⟩⟩

An example of a method for manufacturing the display panel 220 is described.

As a first step, a separation layer is provided over a process substrate and then a layer to be separated with high gas barrier properties is stacked thereover. Note that the process substrate does not need to have flexibility and a substrate having high heat resistance and high dimension stability (e.g., a glass substrate) is preferably used.

As the separation layer, a polyimide layer or a metal layer such as a tungsten layer can be used. As the layer to be separated that is in contact with the separation layer, a silicon oxide layer, a silicon nitride layer with high gas barrier properties, or the like is formed. Two process substrates each with the above-described structure are prepared.

As a second step, a pixel circuit and a display element that is connected to the pixel circuit are formed so as to overlap with the film with high gas barrier properties of one process substrate.

As a third step, a color filter is formed so as to overlap with the film with high gas barrier properties of the other process substrate. There is no limitation on the order of the second step and the third step.

As a fourth step, the one process substrate and the other process substrate are attached to each other using an adhesive so that a side where the pixel circuit and the light-emitting element are formed faces a side where the color filter is formed.

As a fifth step, the one process substrate is separated from the layer to be separated, and a flexible substrate is attached to the layer to be separated that is exposed to the surface. Next, the other process substrate is separated from the layer to be separated, and a flexible substrate is attached to the layer to be separated that is exposed to the surface. Note that an adhesive is used for the attachment. Further, a circularly polarizing plate may be attached to the layer to be separated that is separated from the other process substrate. The number of components in the case of using the circularly polarizing plate can be reduced by direct attachment of the circularly polarizing plate to the layer to be separated.

Through the above steps, the display panel 220 which has flexibility can be formed.

⟪Touch Panel⟫

The touch panel 230 is provided with a touch sensor portion in a region surrounded by a dashed line in the drawing (see FIG. 7A). In the display portion, touch sensors are provided in matrix.

Further, the touch panel 230 is provided with a flexible printed board 239. The touch panel 230 outputs a detected signal to a signal processing circuit or the like that is not shown through the flexible printed board 239.

FIG. 7C illustrates a structure of the touch sensor provided in a region 235 of the touch panel 230. The touch sensor that is illustrated is a projected capacitive type touch sensor. The touch sensor includes an electrode 231 and an electrode 232.

The electrode 231 is formed of a plurality of quadrangular conductive films arranged in a line; the vertexes of the conductive films are connected by the wiring 233. The electrode 232 is formed of a plurality of quadrangular conductive films arranged in a line in a direction intersecting with the electrode 231; the vertexes of the conductive films are electrically connected. The electrode 231 and the electrode 232 are arranged so as to intersect with each other, so that the quadrangular conductive film of the electrode 231 and the quadrangular conductive film of the electrode 232 are arranged in a staggered pattern. Note that an insulating film is formed in a portion where the wiring 233 overlaps with the electrode 232, so that a short circuit between the electrode 231 and the electrode 232 is prevented.

The electrode 231 and the electrode 232 are arranged so that the area of the intersecting portion thereof can be as small as possible, whereby the area of a region where the electrodes are not provided can be reduced. As a result, display unevenness which is brought to the display device by a difference in transmittance depending on whether the electrodes are provided or not can be reduced.

The touch panel 230 is preferably formed to be thin because the weight can be reduced and the transmittance is increased.

As an example of a method for forming a thin touch panel, the following method can be given. A touch sensor is formed over a process substrate having high heat resistance and high dimension stability (e.g., a glass substrate or the like) and the formed touch sensor is transferred from the process substrate to another base material that is thin and lightweight.

Specifically, a separation layer is formed over a glass substrate, and a layer to be separated including a touch sensor is stacked thereover. As the separation layer, a polyimide layer or a metal layer such as a tungsten layer can be used; then, silicon oxide or the like is formed as the layer to be separated so as to be in contact with the metal layer, and a touch sensor is formed thereover. A lightweight film is attached to a top surface of the formed touch sensor. Then, the film to which the layer to be separated is attached is separated at the interface between the separation layer and the layer to be separated, whereby a thin and lightweight touch panel can be formed.

⟪Display Panel with Touch Sensor⟫

The display panel 220 may be provided with a touch sensor. The display panel 220 with a touch sensor can function as the touch panel 230, so that the weight of the display device can be further reduced.

The display panel 220 can be provided with various touch sensors. For example, a capacitor and a photoelectric conversion element can be used for the touch sensor. These elements are arranged in matrix in the display panel, so that coordinates of a region in contact with a finger or the like can be detected.

The touch sensor is provided over the first substrate 221 or the second substrate 222 of the display panel 220. Alternatively, the touch sensor is formed using a structure provided for the first substrate 221 and a structure provided for the second substrate 222.

As a touch sensor provided for the first substrate 221, a photoelectric conversion element can be given as an example. The photoelectric conversion element can optically detect a finger or the like in contact with a surface of the second substrate.

As a touch sensor provided for the second substrate 222, a photoelectric conversion element or a capacitor can be given as an example. The touch sensor can be provided on a side of the second substrate which faces the first substrate; alternatively the touch sensor can be provided on a side of the second substrate which is on a viewer side. The capacitor includes a pair of electrodes, and a change in potential of one electrode caused by a finger or the like in contact with the second substrate is detected.

As a touch sensor formed using a structure provided for the first substrate 221 and a structure provided for the second substrate 222, a capacitor can be given as an example. The capacitor is formed using an electrode provided for the first substrate 221 and an electrode provided for the second substrate 222. A change in capacitance caused by bringing the second substrate closer to the first substrate side by a finger in contact with the second electrode is detected.

In the case where the display panel 220 has an active matrix type, transistors are formed in matrix in the first substrate 221 or the second substrate 222. Further, the transistors and the touch sensor may be provided so as to overlap with each other on the first substrate side of the second substrate 222. The transistor and the touch sensor are provided on the same surface of the substrate, so that a process can be simplified.

This embodiment can be freely combined with any of the other embodiments in this specification.

Embodiment 6

An example of a semiconductor which is preferably used for the region where a channel is formed in the transistor which is shown as an example in the above embodiment is described below.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

When an oxide semiconductor film is used for the transistor, the thickness of the oxide semiconductor film is preferable greater than or equal to 2 nm to less than or equal to 40 nm.

An applicable oxide semiconductor preferably contains at least indium (In) or zinc (Zn). In particular, In and Zn are preferably contained. In addition, as a stabilizer for reducing variation in electrical characteristics of a transistor using the oxide semiconductor, one or more elements selected from gallium (Ga), tin (Sn), hafnium (Hf), zirconium (Zr), titanium (Ti), scandium (Sc), yttrium (Y), and a lanthanoid (such as cerium (Ce), neodymium (Nd), or gadolinium (Gd)) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, $In_2SnO_5(ZnO)_n$ (n>0, n is an integer) may be used.

For example, an In—Ga—Zn-based oxide with an atomic ratio where In:Ga:Zn=1:1:1, In:Ga:Zn=3:1:2, or In:Ga:Zn=2:1:3, or an oxide whose atomic ratio is in the neighborhood of the above compositions can be used.

Further, when the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, after formation of the oxide semiconductor film, it is preferable that dehydration treatment (dehydrogenation treatment) be performed to remove hydrogen or moisture from the oxide semiconductor film so that the oxide semiconductor film is highly purified to contain impurities as little as possible, and that oxygen be added to the oxide semiconductor film to fill oxygen vacancies increased by the dehydration treatment (dehydrogenation treatment).

In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are repaired by the oxygen adding treatment, so that the oxide semiconductor film can be an i-type (intrinsic) oxide semiconductor film or an oxide semiconductor film extremely close to an i-type oxide semiconductor (a substantially i-type oxide semiconductor). Note that the substantially i-type oxide semiconductor means that the oxide semiconductor film includes extremely few (close to zero) carriers derived from a donor, and the carrier concentration thereof is lower than or equal to $1 \times 10^{17}/cm^3$, lower than or equal to $1 \times 10^{16}/cm^3$, lower than or equal to $1 \times 10^{15}/cm^3$, lower than or equal to $1 \times 10^{14}/cm^3$, or lower than or equal to $1 \times 10^{13}/cm^3$.

In this manner, the transistor including an i-type (intrinsic) or substantially i-type oxide semiconductor film can have extremely favorable off-state current characteristics. For example, the drain current at the time when the transistor including an oxide semiconductor film is in an off-state at room temperature (25° C.) can be less than or equal to $1 \times 10^{-18}$ A, preferably less than or equal to $1 \times 10^{-21}$ A, and further preferably $1 \times 10^{-24}$ A; or at 85° C., less than or equal to $1 \times 10^{-15}$ A, preferably $1 \times 10^{-18}$ A, further preferably less than or equal to $1 \times 10^{-21}$ A. An off state of a transistor refers to a state where gate voltage is lower than the threshold voltage in an n-channel transistor. Specifically, the transistor is in an off state when the gate voltage is lower than the threshold voltage by 1V or more, 2V or more, or 3V or more.

An oxide semiconductor film is classified roughly into a single-crystal oxide semiconductor film and a non-single-crystal oxide semiconductor film. The non-single-crystal oxide semiconductor film includes a c-axis aligned crystalline oxide semiconductor (CAAC-OS) film, a polycrystalline oxide semiconductor film, a microcrystalline oxide semiconductor film, an amorphous oxide semiconductor film, and the like. The CAAC-OS film is one of oxide semiconductor films having a plurality of c-axis aligned crystal parts.

Preferably, a CAAC-OS (c-axis aligned crystalline oxide semiconductor) film can be used as the oxide semiconductor film.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 µm$^2$ or more, or 1000 µm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears at a diffraction angle (2θ) of around 31° in some cases. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears at a diffraction angle (2θ) of around 56° in some cases. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

For the deposition of the CAAC-OS film, the following conditions are preferably used.

By increasing the substrate temperature during the deposition, migration of flat-plate-like sputtered particles which have reached the substrate occurs, so that a flat plane of the sputtered particles is attached to the substrate. At this time, the sputtered particle is charged positively, whereby sputtered particles are attached to the substrate while repelling each other; thus, the sputtered particles do not overlap with each other ununiformly, and a CAAC-OS film with a uniform thickness can be deposited. Specifically, the substrate temperature during the deposition is higher than or equal to 100° C. and lower than or equal to 740° C., preferably higher than equal to 200° C. and lower than or equal to 500° C.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the CAAC-OS film for a short time. At the same time, the heat treatment in an inert atmosphere may generate oxygen vacancies in the CAAC-OS film. In this case, the heat treatment in an oxidation atmosphere can reduce the oxygen vacancies. The heat treatment can further increase the crystallinity of the CAAC-OS film. Note that the heat treatment may be performed under a reduced pressure of 1000 Pa or less, 100 Pa or less, 10 Pa or less, or 1 Pa or less. The heat treatment under the reduced atmosphere can reduce the concentration of impurities in the CAAC-OS film for a shorter time.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 1:1:1, 1:1:2, 1:3:2, 2:1:3, 2:2:1, 3:1:1, 3:1:2, 3:1:4, 4:2:3, 8:4:3, or a ratio close to these ratios. The kinds of powder and the molar ratio for mixing powder may be determined as appropriate depending on the desired sputtering target.

Alternatively, the CAAC-OS film may be formed in the following manner.

First, a first oxide semiconductor film is formed to a thickness of greater than or equal to 1 nm and less than 10 nm. The first oxide semiconductor film is formed by a sputtering method. Specifically, the substrate temperature during the deposition is higher than or equal to 100° C. and lower than or equal to 500° C., preferably higher than or equal to 150° C. and lower than or equal to 450° C., and the proportion of oxygen in the deposition gas is higher than or equal to 30 vol. %, preferably 100 vol. %.

Next, heat treatment is performed so that the first oxide semiconductor film serves as a first CAAC-OS film with high crystallinity. The heat treatment is performed at a temperature higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the first oxide semiconductor film in a short time. At the same time, the heat treatment in an inert atmosphere may generate oxygen vacancies in the first oxide semiconductor film. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced atmosphere can reduce the concentration of impurities in the first oxide semiconductor film for a shorter time.

The first oxide semiconductor film with a thickness of greater than or equal to 1 nm and less than 10 nm can be easily crystallized by heat treatment compared to the case where the first oxide semiconductor film has a thickness of greater than or equal to 10 nm.

Next, a second oxide semiconductor film that has the same composition as the first oxide semiconductor film is formed to a thickness of greater than or equal to 10 nm and less than or equal to 50 nm. The second oxide semiconductor film is preferably formed by a sputtering method. Specifically, the substrate temperature during the deposition is higher than or equal to 100° C. and lower than or equal to 500° C., preferably higher than or equal to 150° C. and lower than or equal to 450° C., and the proportion of oxygen in the deposition gas is higher than or equal to 30 vol. %, preferably 100 vol. %.

Next, heat treatment is performed so that solid phase growth of the second oxide semiconductor film from the first CAAC-OS film is performed. Thus, the second CAAC-OS film can have high crystallinity. The temperature of the heat treatment is higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under a reduced pressure can reduce the concentration of impurities in the second oxide semiconductor film in a shorter time.

As described above, the CAAC-OS film with a total thickness of 10 nm or more can be formed.

Further, the oxide semiconductor film may have a structure in which a plurality of oxide semiconductor films is stacked.

For example, the oxide semiconductor film may be provided with, between the oxide semiconductor film (referred to as a first layer for convenience) and a gate insulating film, a second layer which is formed of a constituent element of the first layer and whose electron affinity is lower than that of the first layer by 0.2 eV or more. At this time, when an electric field is applied from the gate electrode, a channel is formed in the first layer, and the channel is not formed in the second layer. The constituent element of the first layer is the same as that of the second layer; thus, interface scattering at the interface between the first layer and the second layer hardly occurs. Thus, provision of the second layer between the first layer and the gate insulating film can increase the field-effect mobility of the transistor.

Further, when a silicon oxide film, a silicon oxynitride film, a silicon nitride oxide film, or a silicon nitride film is used as the gate insulating film, silicon included in the gate insulating film may be mixed into the oxide semiconductor film. When silicon is included in the oxide semiconductor film, a decrease in crystallinity of the oxide semiconductor film, a decrease in carrier mobility, or the like occurs. Thus, the second layer is preferably provided between the first layer and the gate insulating film so that the concentration of silicon in the first layer where a channel is formed is reduced. For the same reason, it is preferable that a third layer which is formed of the constituent element of the first layer and whose electron affinity is lower than that of the first layer by 0.2 eV or more be provided and the first layer be sandwiched between the second layer and the third layer.

Such a structure makes it possible to reduce and further prevent diffusion of impurities such as silicon to a region where a channel is formed, so that a highly reliable transistor can be obtained.

In order to make the oxide semiconductor film a CAAC-OS film, the concentration of silicon in the oxide semiconductor film is set to less than or equal to $2.5 \times 10^{21}/cm^3$. Preferably, the concentration of silicon in the oxide semiconductor film is less than $1.4 \times 10^{21}/cm^3$, preferably $4 \times 10^{19}/cm^3$, more preferably $2.0 \times 10^{18}/cm^3$. This is because the field-effect mobility of the transistor may be reduced when the concentration of silicon in the oxide semiconductor film is $1.4 \times 10^{21}/cm^3$ or more, and the oxide semiconductor film may be made amorphous at the interface with a film in contact with the oxide semiconductor film when the concentration of silicon in the oxide semiconductor film is $4.0 \times 10^{19}/cm^3$ or more. Further, when the concentration of silicon in the oxide semiconductor film is made less than $2.0 \times 10^{18}/cm^3$, improvement in reliability of the transistor and a reduction in the density of state (DOS) in the oxide semiconductor film can be expected. Note that the concentration of silicon in the oxide semiconductor film can be measured by secondary ion mass spectroscopy (SIMS).

This embodiment can be combined with any of the other embodiments disclosed in this specification as appropriate.

Embodiment 7

In this embodiment, examples of electronic devices each provided with a display device of one embodiment of the present invention which includes a display panel mounted on a curved surface, driver circuits including circuit elements which are mounted on a plurality of plane surfaces provided on the back of the curved surface in a stepwise shape along the curved surface are described with reference to FIGS. 8A to 8C.

Figure 8A:
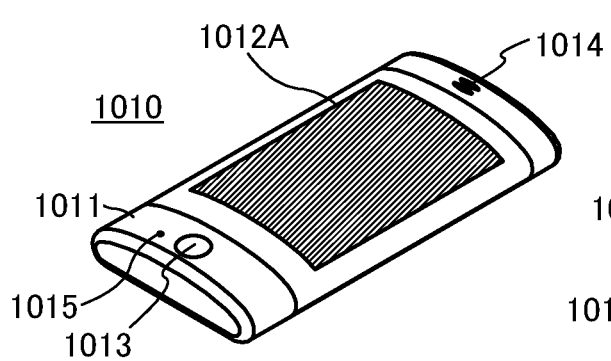
FIGS. 8A to 8C each illustrate an electronic device according to one embodiment of the present invention.
Figure 8B:
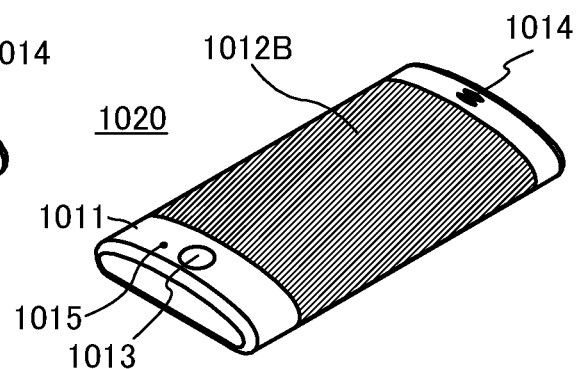
Figure 8C:
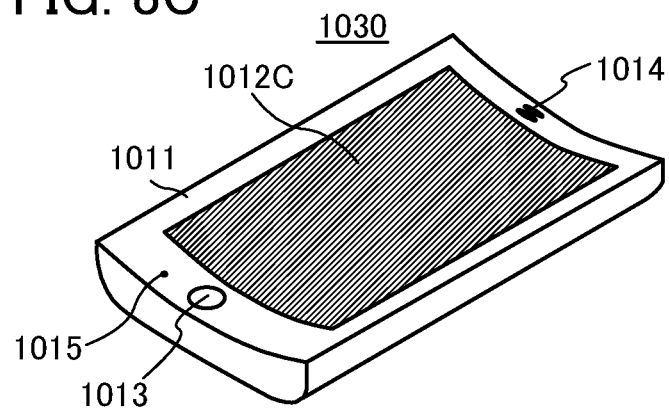

The electronic devices in FIGS. 8A to 8C each illustrate an example of a portable information terminal.

A portable information terminal 1010 in FIG. 8A includes a display device 1012A incorporated in a housing 1011, an operation button 1013, a speaker 1014, and a microphone 1015. Further, although not shown, the portable information terminal 1010 includes a stereo headphone jack, a memory card insertion slot, a camera, an external connection port such as a USB connector, and the like.

Here, the display device of one embodiment of the present invention, which is described in any of the above embodiments, can be used as the display device 1012A. The display device 1012A illustrated in FIG. 8A is an example of a display device including a display panel mounted on a convex curved surface.

A portable information terminal 1020 in FIG. 8B has the same structure as the portable information terminal 1010 and is provided with a display device 1012B including a display panel mounted on a surface that is curved along the side surface of the housing 1011. A portable information terminal 1030 in FIG. 8C has the same structure as the portable information terminal 1010 and is provided with a display device 1012C including a display panel mounted on a concave curved surface. For each of the display device 1012B and the display device 1012C, the display device of one embodiment of the present invention which is described in any of the above embodiments can be used.

An electronic device of one embodiment of the present invention is provided with a display panel having a curved surface on its top surface and a flat portion on its bottom surface. Thus, the electronic device can be placed still on a flat area such as on a desk with the bottom surface of the display device down. Consequently, a display device allowing characters and images displayed on the display panel to be easily seen can be provided.

The portable information terminals illustrated in FIGS. 8A to 8C each serves as one or more of a telephone set, an e-book reader, a personal computer, and a game machine, for example. In addition, the display device may be provided with a touch sensor.

Figure 9A:
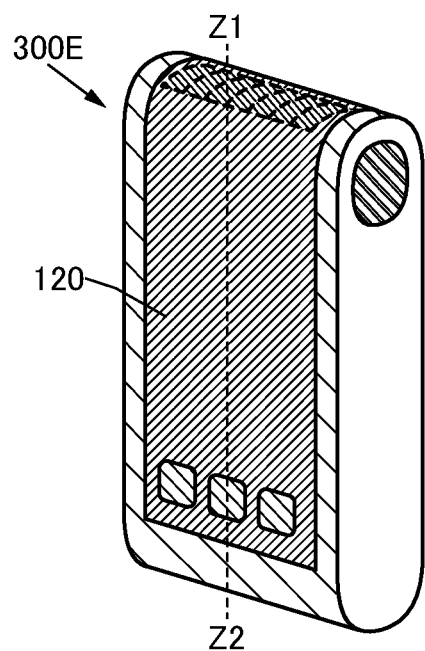
FIGS. 9A to 9D illustrate an electronic device according to one embodiment of the present invention.
Figure 9B:
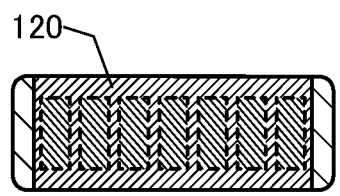
Figure 9C:
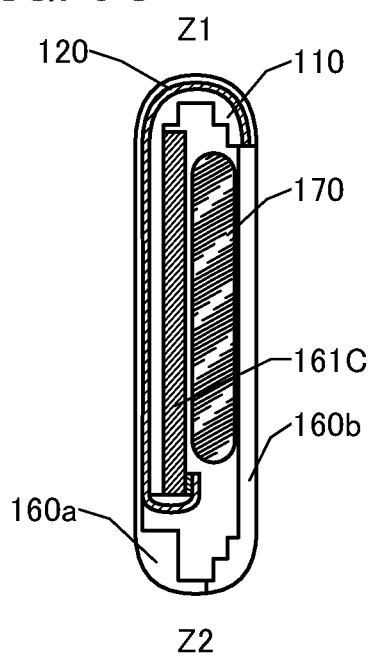
Figure 9D:
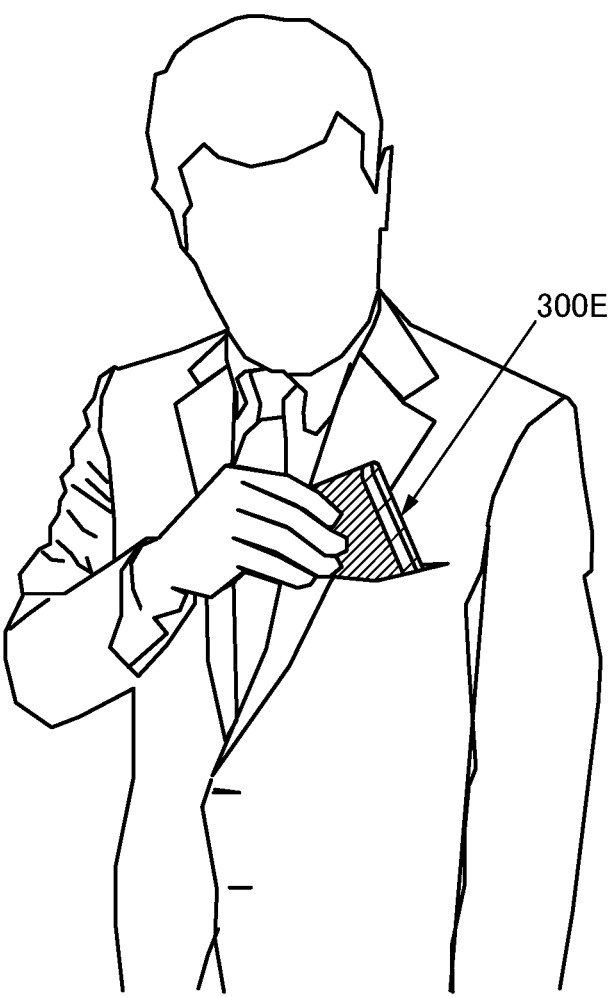

FIGS. 9A to 9D illustrate a portable information terminal 300E. FIG. 9A is a perspective view illustrating an external shape of the portable information terminal 300E. FIG. 9B is a top view thereof. FIG. 9C is a cross-sectional view thereof taken along section line Z1-Z2. FIG. 9D illustrates a use state thereof.

The portable information terminal 300E serves as one or more of a telephone set, a notebook, an information browsing system, and the like, for example. Specifically, the portable information terminal 300E can be used as a smartphone.

The portable information terminal 300E includes a housing 160a, a housing 160b which fits with the housing 160a. In addition, the portable information terminal 300E includes, in a space surrounded by the housing 160a and the housing 160b, a base 110, and a display panel 120 and a printed board 161C for driving the display panel 120 between the housing 160a and the base 110 (see FIG. 9C).

The display panel 120 is provided along a plurality of surfaces of the housing 160a. For example, the display panel 120 which has flexibility is placed along the inner side of the housing 160a. Accordingly, the portable information terminal 300E can display characters and image information on the plurality of surfaces. For example, three operation buttons can be displayed on one surface (see FIG. 9A). Further, information indicated by dashed rectangles can be displayed on another surface (see FIG. 9B).

The portable information terminal 300E can display characters and image information on the plurality of surfaces. Accordingly, a user can see the display with the portable information terminal 300E put in a breast pocket of his/her clothes, for example (see FIG. 9D).

Specifically, a caller's phone number, name, or the like of an incoming call is displayed in a position of the display panel 120 which can be observed from above the portable information terminal 300E. Thus, the user can see the display panel 120 without taking out the portable information terminal 300E from the pocket. Accordingly, the user can receive an incoming call when receiving an urgent request or reject an incoming call when receiving an unnecessary call.

Note that the portable information terminal 300E can be provided with a vibration sensor or the like and a memory device with a program for shifting a mode into an incoming call rejection mode in accordance with vibration detected by the vibration sensor or the like. Thus, the user can shift the mode into the incoming call rejection mode by tapping the portable information terminal 300E over his/her clothes so as to apply vibration.

This embodiment can be combined with any of the other embodiments disclosed in this specification as appropriate.

EXPLANATION OF REFERENCE 10 circuit element
11a planarization layer
11b planarization layer
11c planarization layer
12 wiring
18 through hole
100 display device
110 base
111 multi-layer substrate
111C printed board
111L printed board
111R driver circuit
112a connector
112b connector
114 antenna
115L terminal portion
115R terminal portion
117 metal film
118 through hole
120 display panel
129 flexible printed board
130 touch panel
139 flexible printed board
140 spacer
160a housing
160b housing
160c housing
161C printed board
161L control circuit
161R function circuit
170 battery
170C battery
170L battery
170R battery
200 display device
210 base
220 display panel
226 spacer
229 flexible printed board
233 wiring
230 touch panel
239 flexible printed board
260a housing
260b housing
260c housing
261L control circuit
261R function circuit
270 battery
270C battery
270L battery
270R battery
300 display device
300A display device
300B display device
300C display device
300D display device
400A display device
400B display device
400D display device
400C display device
1010 portable information terminal
1011 housing
1012A display device
1012B display device
1012C display device
1013 touch button
1014 speaker
1015 microphone
1020 portable information terminal
1030 portable information terminal This application is based on Japanese Patent Application serial no. 2012-193575 filed with Japan Patent Office on Sep. 3, 2012, the entire contents of which are hereby incorporated by reference.

The invention claimed is:

1. An electronic device comprising:
a display panel;
a housing;
a curved surface;
a base between the housing and the display panel;
a first electronic circuit board; and
a second electronic circuit board,
wherein the display panel is between the curved surface and the base,
wherein each of the first electronic circuit board and the second electronic circuit board is located between the base and the housing,
wherein, on a side of the curved surface, the base comprises a region curved in a direction same as the curved surface,
wherein, in a cross-sectional view, a terminal portion of the base has a more curved shape than a central portion of the base,
wherein, on a side of the housing, the base comprises a first region and a second region deeper than the first region,
wherein the first electronic circuit board is mounted on the first region,
wherein the second electronic circuit board is mounted on the second region,
wherein each of a side surface of the first electronic circuit board and a side surface of the second electronic circuit board is covered with the base, and
wherein at least one of the first electronic circuit board and the second electronic circuit board is electrically connected to the display panel through a through hole of the base.

2. The electronic device, according to claim 1,
wherein the curved surface overlaps with each of the first electronic circuit board and the second electronic circuit board through the base.

3. The electronic device, according to claim 1,
wherein the curved region of the base overlaps with each of the first electronic circuit board and the second electronic circuit board.

4. The electronic device, according to claim 1,
wherein the curved surface is included in a light-transmitting member.

5. The electronic device, according to claim 1,
wherein an area where the second electronic circuit board and the base overlap with each other is greater than an area where the first electronic circuit board and the base overlap with each other.

6. The electronic device, according to claim 1,
wherein an image on the display panel is configured to be observed from a front surface and a side surface adjacent to the front surface of the electronic device.

7. An electronic device comprising:
a display panel;
a housing;
a curved surface;
a base between the housing and the display panel;
a first electronic circuit board; and
a second electronic circuit board,
wherein the display panel is between the curved surface and the base,
wherein each of the first electronic circuit board and the second electronic circuit board is located between the base and the housing,
wherein, on a side of the curved surface, the base comprises a region curved in a direction same as the curved surface,
wherein, in a cross-sectional view, on the side of the curved surface, the base has a curved shape from a first portion overlapped with one terminal of the display panel to a second portion overlapped with another terminal of the display panel,
wherein, on a side of the housing, the base comprises a first region and a second region deeper than the first region,
wherein the first electronic circuit board is mounted on the first region,
wherein the second electronic circuit board is mounted on the second region,
wherein each of a side surface of the first electronic circuit board and a side surface of the second electronic circuit board is covered with the base, and
wherein at least one of the first electronic circuit board and the second electronic circuit board is electrically connected to the display panel through a through hole of the base.

8. The electronic device, according to claim 7,
wherein the curved surface overlaps with each of the first electronic circuit board and the second electronic circuit board through the base.

9. The electronic device, according to claim 7,
wherein the curved region of the base overlaps with each of the first electronic circuit board and the second electronic circuit board.

10. The electronic device, according to claim 7,
wherein the curved surface is included in a light-transmitting member.

11. The electronic device, according to claim 7,
wherein an area where the second electronic circuit board and the base overlap with each other is greater than an area where the first electronic circuit board and the base overlap with each other.

12. The electronic device, according to claim 7,
wherein an image on the display panel is configured to be observed from a front surface and a side surface adjacent to the front surface of the electronic device.

* * * * *